United States Patent
Tanzil et al.

(10) Patent No.: US 12,126,471 B2
(45) Date of Patent: Oct. 22, 2024

(54) METHOD AND DEVICE(S) FOR PERFORMING DIGITAL PREDISTORTION ON SIGNALS FOR MULTIBAND TRANSMISSION IN A WIRELESS COMMUNICATION NETWORK

(71) Applicant: Telefonaktiebolaget LM Ericsson (publ), Stockholm (SE)

(72) Inventors: S M Shahrear Tanzil, Ottawa (CA); Ashim Biswas, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 22 days.

(21) Appl. No.: 18/026,387

(22) PCT Filed: Oct. 2, 2020

(86) PCT No.: PCT/SE2020/050930
§ 371 (c)(1),
(2) Date: Mar. 15, 2023

(87) PCT Pub. No.: WO2022/071837
PCT Pub. Date: Apr. 7, 2022

(65) Prior Publication Data
US 2023/0291620 A1    Sep. 14, 2023

(51) Int. Cl.
*H03F 1/32* (2006.01)
*H04L 25/03* (2006.01)
*H04L 27/36* (2006.01)

(52) U.S. Cl.
CPC ..... *H04L 25/03343* (2013.01); *H03F 1/3247* (2013.01); *H03F 1/3258* (2013.01); *H04L 27/367* (2013.01)

(58) Field of Classification Search
CPC ............. H04L 25/03343; H04L 27/367; H03F 1/3247
See application file for complete search history.

(56) References Cited

U.S. PATENT DOCUMENTS

2016/0079933 A1*  3/2016  Fehri .................. H03F 3/19
                                                            330/75
2017/0338841 A1   11/2017  Pratt

FOREIGN PATENT DOCUMENTS

WO      2014184774 A1     11/2014

OTHER PUBLICATIONS

International Search Report and Written Opinion of the International Searching Authority, PCT/SE2020/050930, mailed Jun. 10, 2021, 8 pages.

(Continued)

*Primary Examiner* — Rahel Guarino
(74) *Attorney, Agent, or Firm* — Sage Patent Group

(57) ABSTRACT

Method and device(s) for performing digital predistortion, "DPD", on multiple digital input signals to be transmitted in different frequency bands, respectively, of a wireless communication network. The frequency bands being associated with linearization bandwidths, respectively, for application of the DPD. Said DPD is performed in two parts: A first DPD part with a first DPD performed for each of said input signals over the signal's full linearization bandwidth using a first set of non-linear terms and basis functions. A second DPD part where another, second DPD is performed for each of said input signals over the signal's linearization bandwidth except where the linearization bandwidth covers the signal's frequency band using another, second set of non-linear terms and basis functions. Predistorted multiple digital output signals are provided based on both of said performed DPDs.

17 Claims, 11 Drawing Sheets

(56) References Cited

OTHER PUBLICATIONS

Braithwaite, R. Neil, "Reducing estimator biases due to equalization errors in adaptive digital predistortion systems for RF power amplifiers," 2012 IEEE/MTT-S International Microwave Symposium Digest, Montreal, QC, Canada, 2012, pp. 1-3.

Braithwaite, R.N., "Digital Predistortion of an RF Power Amplifier Using a Reduced Volterra Series Model With a Memory Polynomial Estimator," IEEE Transactions of Microwave Theory and Techniques, vol. 65, No. 10, Oct. 2017, 11 pages.

Liu, Ying et al., "Multiband Linearization Technique for Broadband Signal With Multiple Closely Spaced Bands," IEEE Transactions of Microwave Theory and Techniques, vol. 67, No. 3, Mar. 2019, 15 pages.

Younes, Mayada et al., "Linearization of Concurrent Tri-Band Transmitters Using 3-D Phase-Aligned Pruned Volterra Model," IEEE Transactions of Microwave Theory and Techniques, vol. 61, No. 12, Dec. 2013, 10 pages.

\* cited by examiner

METHOD AND DEVICE(S) FOR PERFORMING DIGITAL PREDISTORTION ON SIGNALS FOR MULTIBAND TRANSMISSION IN A WIRELESS COMMUNICATION NETWORK

CROSS REFERENCE TO RELATED APPLICATIONS

This application is a 35 U.S.C. § 371 national stage application of PCT International Application No. PCT/SE2020/050930 filed on Oct. 2, 2020, the disclosure and content of which is incorporated by reference herein in its entirety.

TECHNICAL FIELD

Embodiments herein concern a method and devices(s) for performing digital predistortion, DPD, on multiple digital input signals to be transmitted in different frequency bands, respectively, of a wireless communication network.

BACKGROUND

Communication devices such as wireless communication devices, that simply may be named wireless devices, may also be known as e.g. user equipments (UEs), mobile terminals, wireless terminals and/or mobile stations. A wireless device is enabled to communicate wirelessly in a wireless communication network, wireless communication system, or radio communication system, e.g. a telecommunication network, sometimes also referred to as a cellular radio system, cellular network or cellular communication system. The communication may be performed e.g. between two wireless devices, between a wireless device and a regular telephone and/or between a wireless device and a server via a Radio Access Network (RAN) and possibly one or more core networks, comprised within the cellular communication network. The wireless device may further be referred to as a mobile telephone, cellular telephone, laptop, Personal Digital Assistant (PDA), tablet computer, just to mention some further examples. Wireless devices may be so called Machine to Machine (M2M) devices or Machine Type of Communication (MTC) devices, i.e. devices that are not associated with a conventional user.

The wireless device may be, for example, portable, pocket-storable, hand-held, computer-comprised, or vehicle-mounted mobile device, enabled to communicate voice and/or data, via the RAN, with another entity, such as another wireless device or a server.

The wireless communication network may cover a geographical area which is divided into cell areas, wherein each cell area is served by at least one base station, or Base Station (BS), e.g. a Radio Base Station (RBS), which sometimes may be referred to as e.g. "eNB", "eNodeB", "NodeB", "B node", "gNB", or BTS (Base Transceiver Station), depending on the technology and terminology used. The base stations may be of different classes such as e.g. macro eNodeB, home eNodeB or pico base station, based on transmission power and thereby also cell size. A cell is typically identified by one or more cell identities. The base station at a base station site may provide radio coverage for one or more cells. A cell is thus typically associated with a geographical area where radio coverage for that cell is provided by the base station at the base station site. Cells may overlap so that several cells cover the same geographical area. By the base station providing or serving a cell is typically meant that the base station provides radio coverage such that one or more wireless devices located in the geographical area where the radio coverage is provided may be served by the base station in said cell. When a wireless device is said to be served in or by a cell this implies that the wireless device is served by the base station providing radio coverage for the cell. One base station may serve one or several cells. Further, each base station may support one or several communication technologies. The base stations communicate over the air interface operating on radio frequencies with the wireless device within range of the base stations.

In some RANs, several base stations may be connected, e.g. by landlines or microwave, to a radio network controller, e.g. a Radio Network Controller (RNC) in Universal Mobile Telecommunication System (UMTS), and/or to each other. The radio network controller, also sometimes termed a Base Station Controller (BSC) e.g. in GSM, may supervise and coordinate various activities of the plural base stations connected thereto. GSM is an abbreviation for Global System for Mobile Communication (originally: Groupe Spécial Mobile), which may be referred to as 2nd generation or 2G.

UMTS is a third generation mobile communication system, which may be referred to as 3rd generation or 3G, and which evolved from the GSM, and provides improved mobile communication services based on Wideband Code Division Multiple Access (WCDMA) access technology. UMTS Terrestrial Radio Access Network (UTRAN) is essentially a radio access network using wideband code division multiple access for wireless devices. High Speed Packet Access (HSPA) is an amalgamation of two mobile telephony protocols, High Speed Downlink Packet Access (HSDPA) and High Speed Uplink Packet Access (HSUPA), defined by 3GPP, that extends and improves the performance of existing 3rd generation mobile telecommunication networks utilizing the WCDMA. Such networks may be named WCDMA/HSPA.

The expression downlink (DL) may be used for the transmission path from the base station to the wireless device. The expression uplink (UL) may be used for the transmission path in the opposite direction i.e. from the wireless device to the base station.

In 3rd Generation Partnership Project (3GPP) Long Term Evolution (LTE), base stations, which may be referred to as eNodeBs or eNBs, may be directly connected to other base stations and may be directly connected to one or more core networks. LTE may be referred to as 4th generation or 4G.

The 3GPP has undertaken to evolve further the UTRAN and GSM based radio access network technologies, for example into evolved UTRAN (E-UTRAN) used in LTE.

Work is ongoing with developing a next generation wide area networks, which may be referred to as NeXt generation (NX), New Radio (NR), or fifth generation (5G).

Wideband radio systems that can cover 1 GHz intermediate bandwidth (IBW) or above has been an active area of research from both academia and industry in recent years. Linearization of the power amplifier (PA) is one of the major challenges in designing wideband radio systems since PA is inherently nonlinear when operating at higher efficiency. The nonlinear behaviour of the PA introduces spectral regrowth and typically violates many requirements, e.g. defined by 3GPP. Digital pre-distortion (DPD), which can be considered to work like the inverse of the PA, has been proven a cost-effective solution to linearize PA. The combination of DPD and PA should desirably provide linear output so that e.g. 3GPP requirements can be met.

In wideband radio systems, multiple non-contiguous bands are used to transmit signals over the air. Hence, wideband PA needs to handle multiple input signals simultaneously. Conventionally, the complexity of DPD increases exponentially with the number of input signals, i.e. number of non-contiguous bands. As a result, DPD for multiband, i.e. more than two bands, systems is a challenging problem to solve.

There are some existing solutions for DPD in wideband radio systems. These solutions often take into account entire wideband signals and existing DPD solutions for multiband work quite similar to the single-band problem. These solutions are typically implemented as a look-up table (LUT) and polyphase based linearization.

An example of a prior art technique can be found in M. Younes, A. Kwan, M. Rawat and F. M. Ghannouchi, "*Linearization of Concurrent Tri-Band Transmitters Using* 3-*D Phase-Aligned Pruned Volterra Model*" in IEEE Transactions on Microwave Theory and Techniques, vol. 61, no. 12, pp. 4569-4578, December 2013, doi:10.1109/TMTT.2013.2287176.

SUMMARY

In view of the above, an object is to enable or provide one or more improvements or alternatives in relation to the prior art, in particular to provide improvements regarding multiband digital predistortion, DPD, i.e. DPD on multiple digital input signals to be transmitted in different non-contiguous, i.e. separated, frequency bands, of a wireless communication network.

According to a first aspect of embodiments herein, the object is achieved by a method, performed by one or more devices, for performing digital predistortion, DPD, on multiple digital input signals to be transmitted in different frequency bands, respectively, of a wireless communication network. The frequency bands are associated with linearization bandwidths, respectively, for application of the DPD. Each linearization bandwidth extends from a predetermined first frequency below its associated frequency band to a predetermined second frequency above its associated frequency band. Said device(s) receive said multiple digital input signals and perform said DPD in two parts: A first DPD part where a first DPD is performed for each of said multiple digital input signals over the signal's full linearization bandwidth using a first set of non-linear terms including a first set of basis functions. A second DPD part where another, second DPD is performed for each of said multiple digital input signals over the signal's linearization bandwidth except where the linearization bandwidth covers the signal's frequency band using another, second set of non-linear terms including a second set of basis functions. The device(s) then provides, based on both of said performed DPD parts, predistorted multiple digital output signals.

According to a second aspect of embodiments herein, the object is achieved by a computer program comprising instructions that when executed by a processing circuit causes said one or more devices to perform the method according to the first aspect.

According to a third aspect of embodiments herein, the object is achieved by a carrier comprising the computer program according to the second aspect.

According to a fourth aspect of embodiments herein, the object is achieved by one or more devices for performing digital predistortion, DPD, on multiple digital input signals to be transmitted in different frequency bands, respectively, of a wireless communication network. The frequency bands are associated with linearization bandwidths, respectively, for application of the DPD. Each linearization bandwidth extends from a predetermined first frequency below its associated frequency band to a predetermined second frequency above its associated frequency band. Said device(s) is configured to receive said multiple digital input signals and perform said DPD in two parts: A first DPD part where a first DPD is performed for each of said multiple digital input signals over the signal's full linearization bandwidth using a first set of non-linear terms including a first set of basis functions. A second DPD part where another, second DPD is performed for each of said multiple digital input signals over the signal's linearization bandwidth except where the linearization bandwidth covers the signal's frequency band using another, second set of non-linear terms including a second set of basis functions. The device(s) is further configured to provide, based on both of said performed DPD parts, predistorted multiple digital output signals.

By performing DPD as above, i.e. in said two parts, it is enabled improvements with regard to both error vector magnitude (EVM) and adjacent channel leakage ratio (ACLR) compared to prior art methods. Further, it is enabled scalable and computational efficient implementation, well suitable for multiband, especially in cases where the number of input signals and frequency bands are many, such as 3 or more. Thanks to the above method and embodiments herein it is enabled improved DPD as well as versatile and scalable implementation of this DPD. The method can be implemented using a scalable architecture that facilitates practical application. Furthermore, despite that the method is based on performing DPD in two parts, computations, e.g. of intermodulation products, can be shared between the parts, thus supporting efficient implementation.

Also, the first and second DPD parts as above enable them to be set up and operate in relation to each other in various ways, e.g. sequentially or in parallel, depending on what is most suitable in a practical case and in view of requirements to be met.

BRIEF DESCRIPTION OF THE DRAWINGS

Examples of embodiments herein are described in more detail with reference to the appended schematic drawings, which are briefly described in the following.

FIG. 3 are schematic block diagrams showing an example of a DPD arrangement according to some embodiment herein, and examples of a radio front end and radio transmit observation receiver (TOR) that the DPD arrangement may operate with.

DETAILED DESCRIPTION

Figure 1:
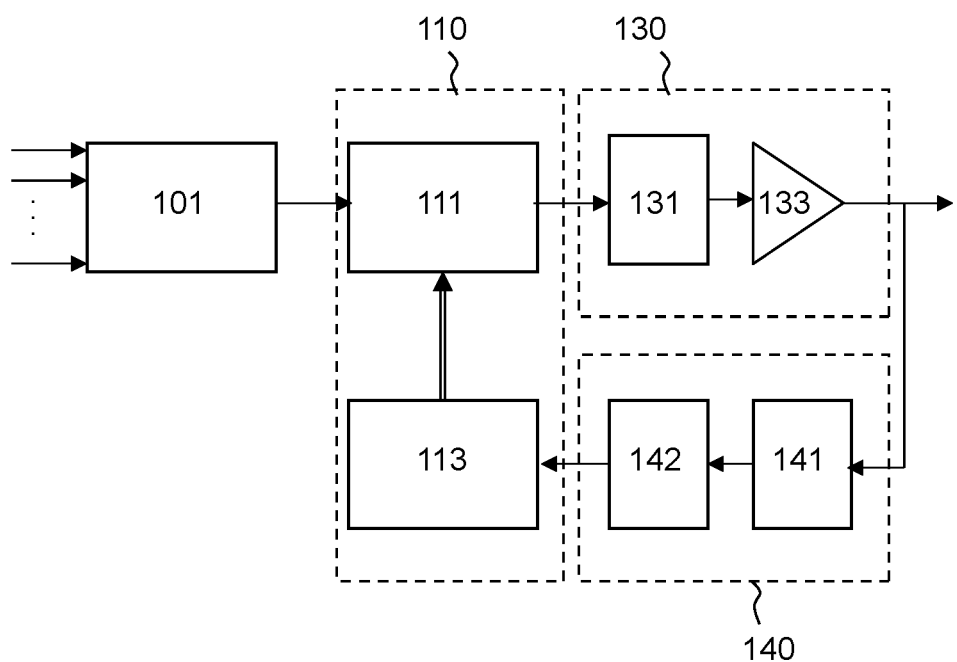
FIG. 1 is a schematic block diagram illustrating an example of a DPD architecture based on the prior art.

Throughout the following description similar reference numerals may be used to denote similar elements, units, modules, circuits, nodes, parts, items or features, when applicable. Features that appear only in some embodiments are, when embodiments are illustrated in a figure, typically indicated by dashed lines.

Embodiments herein are illustrated by exemplary embodiments. It should be noted that these embodiments are not necessarily mutually exclusive. Components from one embodiment may be tacitly assumed to be present in another embodiment and it will be obvious to a person skilled in the art how those components may be used in the other exemplary embodiments.

As part of the development of embodiments herein, the situation indicated in the Background will first be further elaborated upon.

Digital predistortion (DPD) has been an active area of research for a long time. Most of the work performed in the area agree that PA nonlinearity and memory effect can be captured using a Volterra series. As a result, DPD can be modelled using variants of the Volterra series such as memory polynomial (MP) and generalized memory polynomial model (GMP). Typically, MP/GMP model is implemented using look up tables (LUT) in the existing industrial products as indicated in the Background. As mentioned above, one of the ways to solve multiband DPD is to consider entire wideband signals and treat DPD as a single band problem. This method is proven quite effective for single and dual band cases. However, when extending this solution for further bands, there are two major drawbacks: I) it requires a higher sampling rate for the DPD which increases hardware cost and become quite expensive in case of e.g. 1 GHz intermediate bandwidth (IBW) signals, and II) a single global polynomial may not be able to capture the inverse of the PA behavior, resulting in poor DPD outcome.

FIG. 1 is a schematic block diagram illustrating an example of a DPD architecture for application to single band or multiband signals based on the prior art. Multiband digital baseband data, corresponding to multiband input signals, from previous radio modules are input to a digital upconverter 101. The output of the digital upconverter 101 is then input to a DPD unit 110 comprising a DPD actuator 111 and a DPD adaptor 113. The output of the DPD unit 111 and DPD, performed by the DPS actuator, i.e. DPD output signals that correspond to predistorted versions of the input signals, respectively. The output of the DPD unit 110, i.e. the predistorted signals, are input to a radio front end 130 that comprises a radio frequency digital to analogue converter (RF DAC). The resulting analogue signal is then power amplified by a power amplifier 133 and transmitted by an antenna. There is also a radio transit observation receiver (TOR) 140 that receives the power amplified signal and converts it back to the digital domain to be used for feedback to the DPD adaptor so it can adapt DPD coefficients based on it and provide the DPD coefficients to the DPD actuator 111. The radio TOR 140 comprises a RF analogue to digital converter (RF ADC) and a signal conditioning module 142.

The kind of architecture as in FIG. 1 is typically suitable for systems with total IBW of 400 MHz or less. As mentioned earlier, this architecture requires high sampling rates and hence increases the computational cost significantly when applied to a system with e.g. 1 GHz or above IBW. Another disadvantage in the multiband case is that the bands are likely to be located wide apart and the linearization will be then be done unnecessarily much in "whitespace" regions, which will get filtered out anyway by the radio frontend.

To mitigate some of these and similar issues, separate DPD techniques have been introduced and are used for wideband radio systems. Such technique may also be referred to as frequency selective DPD and can result in better performance. Here, DPD only focuses on a region of interest and often operates at a lower sample rate than the previously described one. Hence, such technique may appear as a cost-effective solution for multiband systems. Additionally, multiple DPDs are used, where each region of interest has its own DPD. In this case, DPD only linearizes a part of the spectrum, typically adjacent to the input bands or region of interest.

Most of the separate DPD related work has focused on parameter identification such as identifying polynomial order, memory taps and estimation of corresponding DPD coefficients in the MP/GMP model, see e.g. the reference in the Background and Y. Liu et al., "*Multiband Linearization Technique for Broadband Signal With Multiple Closely Spaced Bands*" in *IEEE Transactions on Microwave Theory and Techniques*, vol. 67, no. 3, pp. 1115-1129, March 2019, doi: 10.1109/TMTT.2018.2884413.

Moreover, the performance of the DPD depends on correct DPD coefficient estimations which can be susceptible to observation and equalization errors. Although not for multiband, some attempts have been made in the prior art to mitigate these kind of issues based on using a notch filter in the parameter estimations that can improve adjacent channel leakage ratio (ACLR). See e.g. R. N. Braithwaite, "*Reducing estimator biases due to equalization errors in adaptive digital predistortion systems for RF power amplifiers*", 2012 *IEEE/MTT-S International Microwave Symposium Digest*, Montreal, QC, 2012, pp. 1-3, doi: 10.1109/MWSYM.2012.6259430 and also R. N. Braithwaite, "*Digital Predistortion of an RF Power Amplifier Using a Reduced Volterra Series Model With a Memory Polynomial Estimator,*" in *IEEE Transactions on Microwave Theory and Techniques*, vol. 65, no. 10, pp. 3613-3623, October 2017, doi: 10.1109/TMTT.2017.2729513.

However, the solutions presented in these disclosures do not consider multiband cases and do not address the error vector magnitude (EVM), which often is part of requirements to be met and can be considered a crucial 3GPP requirement.

Embodiments herein are, unlike the methods of these references and the prior art, based on the idea of a multiband transmitter architecture that can be implemented using notch filters in the parameter estimations. However, as it turned out, using notch filter only improves ACLR performance, but degrades EVM. Hence, to improve also EVM, the idea was extended to what may be described as a cascade DPD method, that not only takes care of ACLR but also considers EVM by using two separate DPD parts, i.e. based on performing DPD on input signals in two DPD parts or steps. This may be referred to as "Multiband Separate Cascade Notch" DPD in the following, although the idea has been somewhat extended and also encompasses performing DPD of the parts in parallel to thereafter combining the results. The multiband separate cascade notch DPD may thus be described as operating in two parts, stages or steps. In each part multiband separate DPD similar basis functions and nonlinear terms as described in the prior art may be used. Embodiments herein rather focus on what each part provides, how they relate to each other to enable improvements of both ACLR and EVM, and how to support and facilitate implementation, although also underlying mathematically based realizations will be explained as well in the following.

For example:

In a step or part 1, DPD coefficients may be estimated and DPD be performed for an entire region of interest corresponding to a linearization bandwidth, that covers the input signal bandwidth and typically are several, such as five, times the input signal bandwidth. The input signal bandwidth corresponds to the bandwidth intended for the signal transmission. This step may be referred to as full band DPD and is for improving both EVM and ACLR.

In a step or part 2, the output of the full band DPD from step 1 is sent to another, second DPD that is performed. A notch filter is here used per band to remove signals that fall inside the carrier, i.e. the signal bandwidth. This part may also be described as adjusting the basis function per band while removing the in carrier part from the basis function. As a result, the second DPD part can be considered to only focus on the outside of the carrier, i.e. outside the signal bandwidth, and is for improving ACLR. Another way to describe this part is that it is used to contribute where it is needed after the first step, which is outside of the carrier, while it may be completely ignored what is happening inside the carrier. Also this step operate only on the linearization bandwidth.

More details regarding implementation are provided below.

Tests and analyses were performed on an experimental implementation based on embodiments herein and compared to prior art implementations. Also here more details follow below, but in short the experiments showed improved EVM compared to prior art implementations based on e.g. the mentioned separate DPD method referred to above. It additionally also improved ACLR, in the test by at least 3 dBc compared to prior art implementations based on the multiband DPD prior art methods referred to in the Background and above. Embodiments herein was thus found to enable improved ACLR compared to prior art methods, without degrading EVM.

In other words, embodiments herein enable improvements regarding multiband DPD, i.e. DPD on multiple digital input signals to be transmitted in different non-contiguous, i.e. separated, frequency bands, of a wireless communication network.

Before describing embodiments herein further and in greater detail, a wireless communication network will be described for providing a context in which embodiments herein may be implemented and utilized.

Figure 2:
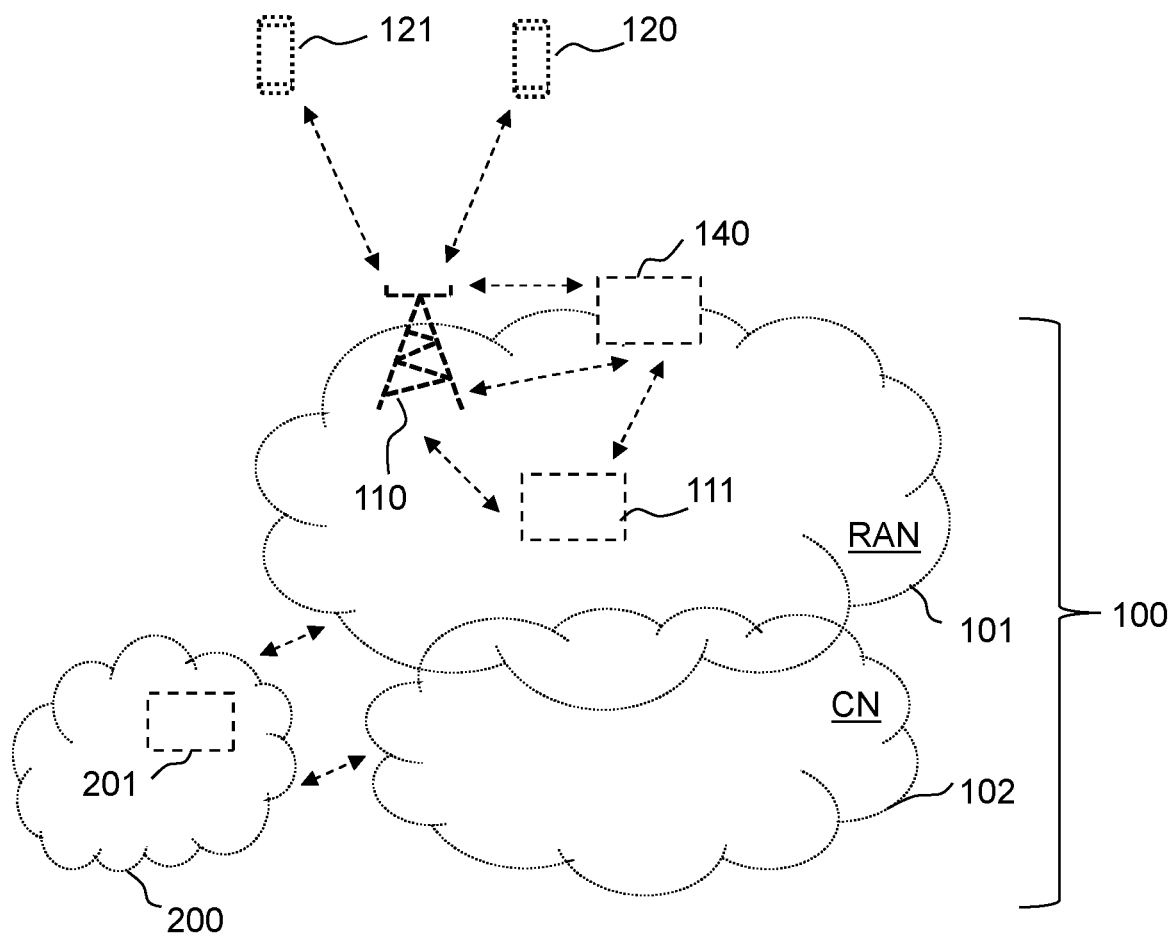
FIG. 2 is a block diagram schematically depicting a wireless communication network in which embodiments herein may be implemented and utilized.

FIG. 2 is a block diagram schematically depicting a wireless communication network 100 in which embodiments herein may be implemented and utilized.

The wireless communication network 100 may comprise a Radio Access Network (RAN) 101 part and a Core Network (CN) 102 part. The wireless communication network 100 may be a telecommunication network or system, such as a cellular communication network that supports at least one Radio Access Technology (RAT), e.g. LTE, or 4G, and/or New Radio (NR) that also may be referred to as 5G, or even further generations.

The wireless communication network 100 typically comprises network nodes that are communicatively interconnected. The network nodes may be logical and/or physical and are located in one or more physical devices. The wireless communication network 100, typically the RAN 101, comprises one or more radio network nodes, e.g. radio network node 110. The radio network nodes are or comprise radio transmitting and/or receiving network nodes, such as base stations and/or are or comprises controlling nodes that control one or more radio transmitting and/or receiving network nodes. The radio network nodes are configured to serve and/or control and/or manage one or more wireless communication devices. Each radio network node provide one or more radio coverages, e.g. corresponding to one or more radio coverage areas, i.e. radio coverage that enables communication with one or more wireless communication devices. A wireless communication device may alternatively be named a wireless device and it may correspond to a UE etc. as mentioned in the Background. Each radio coverage may be provided by and/or associated with a particular Radio Access Technology (RAT). Each radio coverage area may correspond to a so called cell or a radio beam, that simply may be named a beam. As should be recognized by the skilled person, a beam is a more dynamic and relatively narrow and directional radio coverage compared to a conventional cell, and may be accomplished by so called beamforming. A beam is typically for serving one or a few communication devices at the same time, and may be specifically set up for serving one or few communication devices. The beam may be changed dynamically by beamforming to provide desirable coverage for the one or more wireless communication devices being served by the beam. There may be more than one beam provided by one and the same radio network node.

Said radio network nodes may e.g. be communicatively connected, such as configured to communicate, over, or via, a certain communication interface and/or communication link.

Further, the wireless communication network 100, or rather the CN 102, typically comprises one or more core network nodes, that may be communicatively connected to each other and other network nodes, such as configured to communicate, over, or via, a communication interface and/or communication link, with radio network nodes of the RAN 101, e.g. with the radio network node 110.

The figure also shows wireless communication devices 120, 121 for communication with the wireless communication network 100, e.g. by being served by the wireless communication network 100, e.g. by the radio network node 110 when within radio coverage associated with it. Radio communication between wireless communication devices and the radio network nodes of the wireless communication network take part over radio channels between each wireless communication device, e.g. 120, and the radio network node 110.

The figure also shows a further node 201 and a further network 200. The further node 201 may be located outside the wireless communication network 100, i.e. be an external node, as indicated in the figure, or alternatively (not indicated in the figure) be comprised in the wireless communication network 100 and thus be a network node thereof, e.g. a management node thereof. The further network node 201 may in principle be any node communicatively connected to the wireless communication network 100. Likewise, the further network 200 may be located outside the wireless communication network 100, i.e. be an external network, as indicated in the figure, e.g. corresponding to a so-called computer cloud, often simply referred to as cloud, that may provide and/or implement services and/or functions for and/or relating to the wireless communication network 100. The further network 200 may alternatively (not indicated in the figure) be comprised in the wireless communication network 100 and thus e.g. correspond to a subnetwork thereof. It is implied that a network 100 and the further network 200 comprises interconnected network nodes and may e.g. include the further node 201 as indicated in the figure. The further network 200 may in principle be any network communicatively connected to the wireless communication network.

Embodiments herein, and DPD in general, are typically performed by a radio network node, e.g. base station, such as the radio network node 110, but may alternatively e.g. be performed by another network node, e.g. a network node 111, comprised in the wireless communication network 100, connected to a radio network node and that provides data to be transmitted by the radio network node. Such radio network node 111 may be locate in the RAN 101 or in the CN 102

Moreover, shown in the figure is a radio transmit observation receiver (TOR) 140 that may receive radio signals from the radio network node 110 and feedback the received signals in digital format to the network 100 and e.g. the radio network node. How such radio TOR may be used with embodiments herein will be discussed in further detail below.

Attention is drawn to that FIG. 2 is only schematic and for exemplifying purpose and that not everything shown in the figure may be required for all embodiments herein, as should be evident to the skilled person. Also, a wireless communication network or networks that correspond(s) to the wireless communication network 100, will typically comprise several further network nodes, such as further radio network nodes, e.g. base stations, network nodes, e.g. both radio and core network nodes, etc., as realized by the skilled person, but which are not shown herein for the sake of simplifying.

Figure 3A:
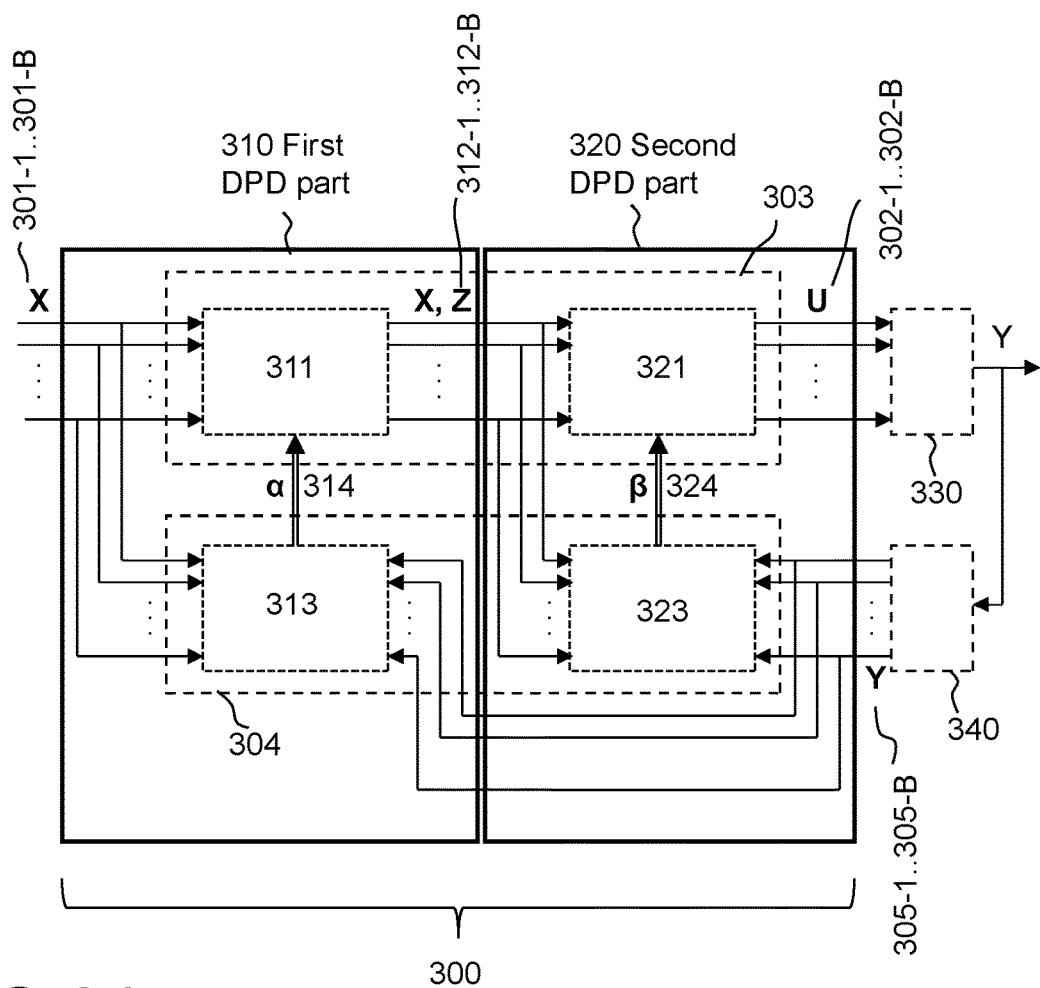

FIG. 3 are schematic block diagrams showing an example of a DPD architecture or DPD arrangement 300 according to some embodiment herein, and examples of a radio front end 330 and radio transmit observation receiver (TOR) 340 that the DPD arrangement 300 may operate with. The DPD architecture 300 is for implementing such Multiband Separate Cascade Notch DPD as mentioned above and for performing a corresponding method according to some embodiments herein. The figure will be used for describing the involved DPDs, how they relate to each other, underlying mathematical relations and explanations regarding embodiments herein, including some conclusions from this that are utilized in some embodiments to provide further advantages.

FIG. 3 and what is described below may be compared to the architecture shown in FIG. 1 for implementing prior art based methods. The architecture shown in FIG. 3 is not only more suitable to handle narrower IBW compared to the prior art, but is also scalable and efficient when the number of bands to handle and IBW increases. The shown architecture is efficient in terms of resource requirements since it supports selective targeting of spectral regions subject for, or requiring, linearization from DPD. The scalability is separately discussed further below.

As shown in the figure, the arrangement 300 and corresponding method involve a DPD that comprises two parts or stages, a first DPD part 310 and a second DPD part 320. The DPD operate on multiple digital input signals 301-1 . . . 301-B, also denoted X in the figure and below, to be transmitted in different frequency bands, respectively, such as frequency bands of a wireless communication network, e.g. the wireless communication network 100. That is, there are B frequency bands where B>1, although benefits with embodiments herein may increase with a higher number B, e.g. B>2 and above. The multiple digital input signals 301-1 . . . 301-B typically correspond to digital baseband data from previous radio modules.

Figure 3B:
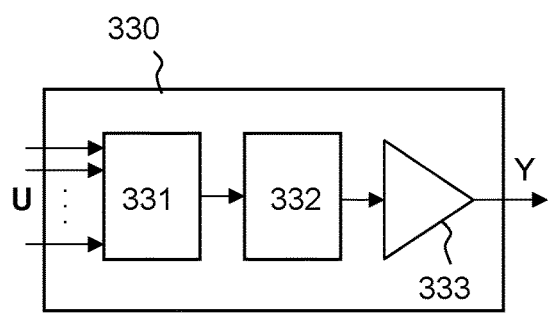

The output of the DPD arrangement 300 are predistorted multiple digital output signals 302-1 . . . 302-B, also denoted U in the figure and below, each thus corresponding to a predistorted version of a corresponding input signal, e.g. output signal 302-1 is a predistorted version of the input signal 301-1, $U_l$ is a predistorted version of input signal $X_l$ for the l:th band of the B bands, etc. Note that a digital signal typically is represented by a sequence of samples and thus that e.g. $X_l$ may correspond to and/or be represented by input samples. The predistorted output signals from the DPD arrangement 300 are then input to a suitable radio front, e.g. the radio front end 330, comprising the power amplification etc. For example, as shown in FIG. 3B, the radio front end 330 may comprise a digital upconverter 331, a radio frequency digital to analogue converter (RF DAC) 332 and a power amplifier (PA) 333. A resulting analogue output signal Y of the radio front end 330 is then transmitted by an antenna (not shown in FIG. 3), e.g. part of a base station or radio network node, such as the radio network node 110.

Figure 3C:
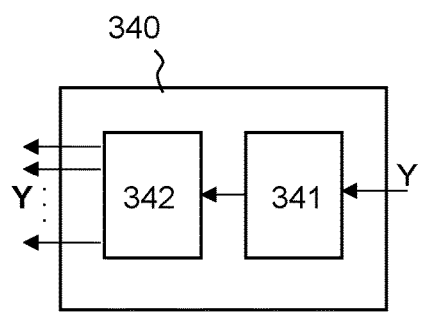

The radio TOR may, as shown in FIG. 3C, comprise a radio frequency analogue to digital converter (RF ADC) 341 and a bandpass filter bank 342. Hence, for the feedback of the distorted signal, i.e. after power amplification etc, of the DPDs, the radio TOR 340 may take the analogue output signal Y as input and pass it through the RF ADC 341 and the bandpass filter bank 342, resulting in digital feedback signals 305-1 . . . 305-B, also denoted Y herein.

The first DPD part 310 is here for pre-distorting the full linearization bandwidth of each input signal and may be referred to as "full band" DPD. Some details regarding this part or stage are described in Equations below. The second DPD part 320, i.e. corresponding to the second stage, is implemented in a similar manner, however this part instead focuses on predistortion of only "out of carrier" frequency components, i.e. within the linearization bandwidth of each input signal but outside the signal's frequency band and may be referred to as "out of carrier" DPD. The second DPD part 320 is described in equations Eq. 4-6 below. In the following the method is described for memory polynomial. However, it should be noted the method, as recognized by the skilled person, can be easily be extended to also generalized memory polynomial by adding suitable different delay terms. This is further commented separately below. The method is also applicable to other variants of the Volterra series.

Note that in the equations that follow, scalars may be identified by normal or italicized text, vectors by bold-italic text and matrices by bold text.

First DPD Part—"Full Band" DPD

The first DPD part 310 has a DPD actuator 311 that takes into account the total linearization bandwidth for each of the B bands where each band's input samples are denoted by $x_l(n)$, and output samples are denoted by $z_l(n)$ in the following. Here n represents time-index and $l \in (1, B)$ refers to the band index. P represents the maximum non-linear order of the DPD. Memory taps are denoted by a set $\mathbb{Q}=\{Q_0, Q_1, Q_2, \ldots Q_M\}$ with $Q_0=0$. As such, the cardinality of $\mathbb{Q}$ is $M+1$.

The output of the DPD actuator 311 is, as shown in the figure, intermediate signals 312-1 ... 312-B, also denoted Z, that result from when the DPD actuator 311 is operating on the input signals 301-1 ... 301-B, i.e. X.

The first DPD part 310 also has a DPD adaptor 313 that as shown in the figure takes the input signals 301-1 ... 301-B, i.e. X, and the digital feedback signals 305-1 ... 305-B, i.e. Y, as input and provides DPD coefficients 314, also denoted $\alpha$ herein, as output and to the DPD actuator 311.

The DPD actuator 311 output can be written as:

$$z_l(n) = x_l(n) + \sum_{m=0}^{M} x_l(n-Q_m) \sum_{p_1=0}^{P-1} \sum_{p_2=0}^{p_1} \quad \text{(Eq. 1)}$$

$$\ldots \sum_{p_B=0}^{p_{B-1}} \alpha_{l,m,p_1,p_2,\ldots,p_B} \prod_{b=1}^{B} |x_b(n-Q_m)|^{(p_b-p_{b+1})},$$

where $p_1=(0, (P-1))$, and with the restriction $p_{b+1} \in (0, p_b)$ and $p_{B+1}=0$. The equation basically describes that the non-linear modelling of inverse of PA, i.e. pre-distortion that can be achieved by current sample and past samples because of memory effects inherent in any electronic device, but also those samples go through modulation by the instantaneous amplitude of the samples getting injected to the PA. Being a non-linear entity the device creates intermodulation frequencies and that is depicted by B multiplicative terms and exponents $p_b$. In absence of memory and non-linearities the equation would simply have been $z_l(n)=x_l(n)$.

Equation 1 can be rewritten in compact form:

$$z_l(n)=x_l(n)+\Sigma_{m=0}^{M} x_l(n-Q_m) \Sigma_{p_1=0}^{P-1} \Sigma_{p_2=0}^{p_1} \ldots$$
$$\Sigma_{p_B=0}^{p_{B-1}} \alpha_{l,m,p_1,p_2,\ldots,p_B} \psi_{p_1,p_2,\ldots,p_B}(n-Q_m) \quad \text{(Eq. 2),}$$

where $\psi_{p_1,p_2,\ldots,p_B}(n)=\Pi_{b=1}^{B}|x_b(n)|^{(p_b-p_{b+1})}$.

Equation 2 can be rewritten in matrix form:

$$Z_l=X_{l,0}+\Sigma_{m=0}^{M} X_{l,m} \circ (S_m \alpha_{l,m})=X_{l,0}+\Sigma_{m=0}^{M}(X_{l,m} \circ S_m) \alpha_{l,m} \quad \text{(Eq. 3)}$$

Here, $\alpha_{l,m}=[\alpha_{l,m,0,0,\ldots,0}, \ldots, \alpha_{l,m,p_1,p_2,\ldots,p_B}, \ldots, \alpha_{l,m,p_B,p_B,\ldots,p_B}]^T$ refers to all the coefficients for $l^{th}$ band and $m^{th}$ memory tap and $(\cdot)^T$ denotes transpose. $X_{l,m}$ denotes $m^{th}$ column of $X_l$, a $N \times (M+1)$ matrix as shown in Equation 3a below. The number of elements for $\alpha_{l,m}$ can be shown to be equal to $$N_{coeff} = \frac{1}{(P-1)!}\prod_{r=1}^{B}(P-1+r).$$

$$X_l = \begin{bmatrix} x_l(n) & x_l(n-Q_1) & & x_l(n-Q_M) \\ x_l(n-1) & x_l(n-Q_1-1) & & x_l(n-Q_M-1) \\ \vdots & \vdots & \ddots & \vdots \\ x_l(n-N+1) & x_l(n-Q_1-N+1) & & x_l(n-Q_M-N+1) \end{bmatrix} \quad \text{(Eq. 3a)}$$

Similarly, $S(n)=[\psi_{0,0,\ldots,0}(n), \psi_{p_1,p_2,\ldots,p_B}(n), \ldots, \psi_{p_B,p_B,\ldots,p_B}(n)]$ with also $N_{coeff}$ elements, is a row vector that contains all the terms in the basis function for $n^{th}$ sample at $Q_m$ memory tap where. Also, $S_m$ denotes $m^{th}$ column of S (shown below).

$$S = \begin{bmatrix} S(n) & S(n-Q_1) & & S(n-Q_M) \\ S(n-1) & S(n-Q_1-1) & & S(n-Q_M-1) \\ \vdots & \vdots & \ddots & \vdots \\ S(n-N+1) & S(n-Q_1-N+1) & & S(n-Q_M-N+1) \end{bmatrix} \quad \text{(Eq. 3b)}$$

In Equation 3, $Z_l$ which is the short form of $Z_{l,0}$ is a column vector that contains all the N samples. The operator ($\circ$) denotes Hadamard multiplication. Note that Hadamard multiplication of a column vector and matrix above is extended form of original vector-vector multiplication where the column vector is multiplied with each column of matrix elementwise and the dimension of the matrix remains the same as the original one. In this case output of $(X_{l,m} \circ S_m)$ will have the dimension of $S_m$.

Second DPD Part—"Out of Carrier" DPD

The second DPD part 320 has a DPD actuator 321 that may be implemented almost similarly for B bands. Here $z_l(n)$ and $u_l(n)$ are used to denote input and output of the out of carrier DPD, respectively.

The output of the DPD actuator 321 is here, as shown in the figure, said predistorted multiple digital output signals 302-1 ... 302-B, or U. These result from the DPD actuator 321 operating on the input signals 301-1 ... 301-B, i.e. X and the intermediate signals 312-1 ... 312-B, i.e. Z.

The second DPD part 320 also has a DPD adaptor 323 takes the input signals 301-1 ... 301-B, i.e. X, and the digital feedback signals 305-1 ... 305-B, i.e. Y, as input and provides DPD coefficients 324, also denoted $\beta$ herein, as output and to the DPD actuator 321. Thus, $\beta$ refers to the out of carrier DPD coefficients which are different from previous full band DPD coefficients, $\alpha$. Additionally, the basis functions are here filtered by complex baseband notch filter denoted by the operation $H_l(\ )$. A typical specification of the notch filter is exemplified and separately discussed below in relation to FIG. 7. The out of carrier DPD output can be expressed:

$$u_l(n) = z_l(n) + H_l\left(\sum_{m=0}^{M} x_l(n-Q_m) \sum_{p_1=0}^{P-1} \sum_{p_2=0}^{p_1}\right. \quad \text{(Eq. 4)}$$

$$\left.\ldots \sum_{p_B=0}^{p_{B-1}} \beta_{l,m,p_1,p_2,\ldots,p_B} \prod_{b=1}^{B} |x_b(n-Q_m)|^{(p_b-p_{b+1})}\right)$$

Please note that the basis function here can be constructed by either using $x_l$ or $z_l$. The main difference is this stage considers the output of the first DPD part 310, i.e. $z_l(n)$ in the DPD actuator 321. Also, in this part the basis function passes through a notch filter that removes an in carrier part of the basis function. Out of carrier DPD coefficients are also different from the first DPD part 310, i.e. full band DPD. In Equation 4 the same nonlinear order P and memory taps are used for simplicity, however, as realized, this is not necessary. The second DPD part 320 may use or even require different nonlinear order and different memory taps.

Similar as for Equation 2, Equation 4 can be expressed:

$$u_l(n)=z_l(n)+H_l(\Sigma_{m=0}^{M} x_l(n-Q_m)\Sigma_{p_1=0}^{P-1}\Sigma_{p_2=0}^{p_1}\ldots$$
$$\Sigma_{p_B=0}^{p_{B-1}} \beta_{l,m,p_1,p_2,\ldots,p_B} \psi_{p_1,p_2,\ldots,p_B}(n-Q_m)) \quad \text{(Eq 5)}$$

Here the definition of $\psi_{p_1,p_2,\ldots,p_B}(n-Q_m)$ remains the same as defined above.

Also Equation 5 can be rewritten in the compact form:

$$U_l=Z_{l,0}+H_l(\Sigma_{m=0}^{M} X_{l,m} \circ (S_m \beta_{l,m}))=$$
$$Z_{l,0}+\Sigma_{m=0}^{M} H_l(X_{l,m} \circ S_m) \beta_{l,m} \quad \text{(Eq. 6)}$$

Here, $\beta_{l,m}=[\beta_{l,m,0,0}, \ldots, 0, \ldots, \beta_{l,m,p_1,p_2}, \ldots, p_B, \ldots, \beta_{l,m,p_B,p_B}, \ldots, p_B]^T$ and $X_{l,m}$ and $S_m$ remain same as defined above. $U_l$ is a short form of $U_{l,0}$ and a column vector that contains all the N samples. Also $Z_{l,m}$ denotes $m^{th}$ column of $Z_l$ as shown below.

$$Z_l = \begin{bmatrix} z_l(n) & z_l(n-Q_1) & z_l(n-Q_M) \\ z_l(n-1) & z_l(n-Q_1-1) & z_l(n-Q_M-1) \\ \vdots & \vdots & \ddots & \vdots \\ z_l(n-N+1) & z_l(n-Q_1-N+1) & z_l(n-Q_M-N+1) \end{bmatrix} \quad \text{(Eq. 6a)}$$

Further, in Equation 6, $U_l$ is the short form of $U_{l,0}$ is a column vector that contains all the N samples.

Scalable Implementation

How Equations 3 and 6 have been constructed and presented above reveals structures that can be exploited for scalable and efficient implementation of both types of DPDs, i.e. of both the first DPD part 310 and the second DPD part 320. The matrix S above may be considered to correspond to intermodulation products and result from a Multi-Band Intermodulation Model (MBIM), or MBIM module or block, that computes the intermodulation products.

Figure 4A:
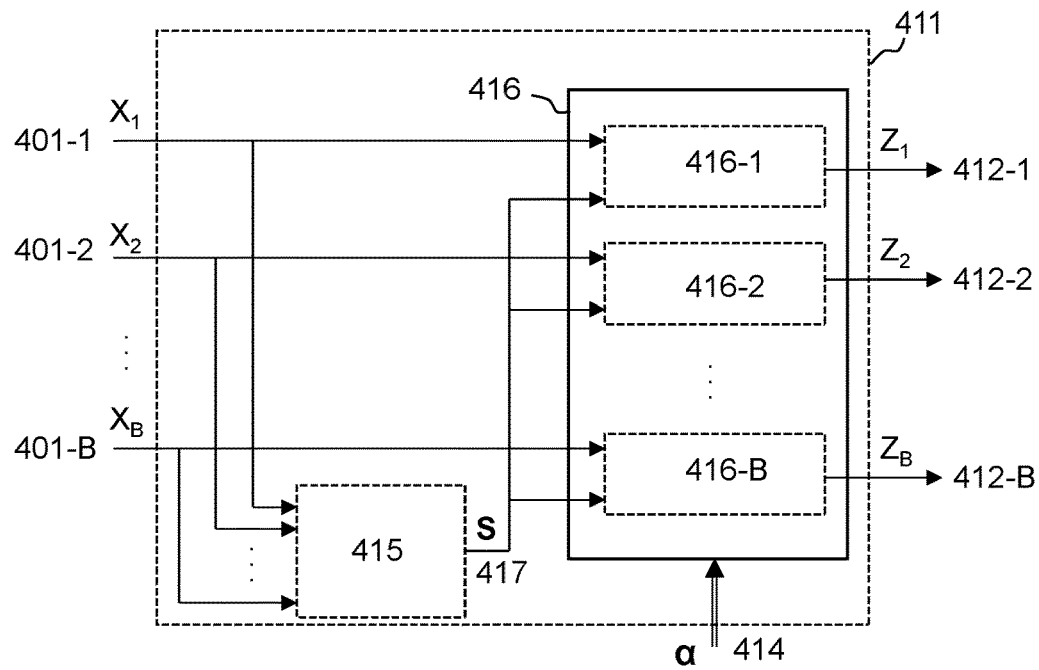
FIG. 4 schematically show how DPD actuators of first and second DPD parts according to embodiments herein may be implemented in a scalable and computational efficient way.
Figure 4B:
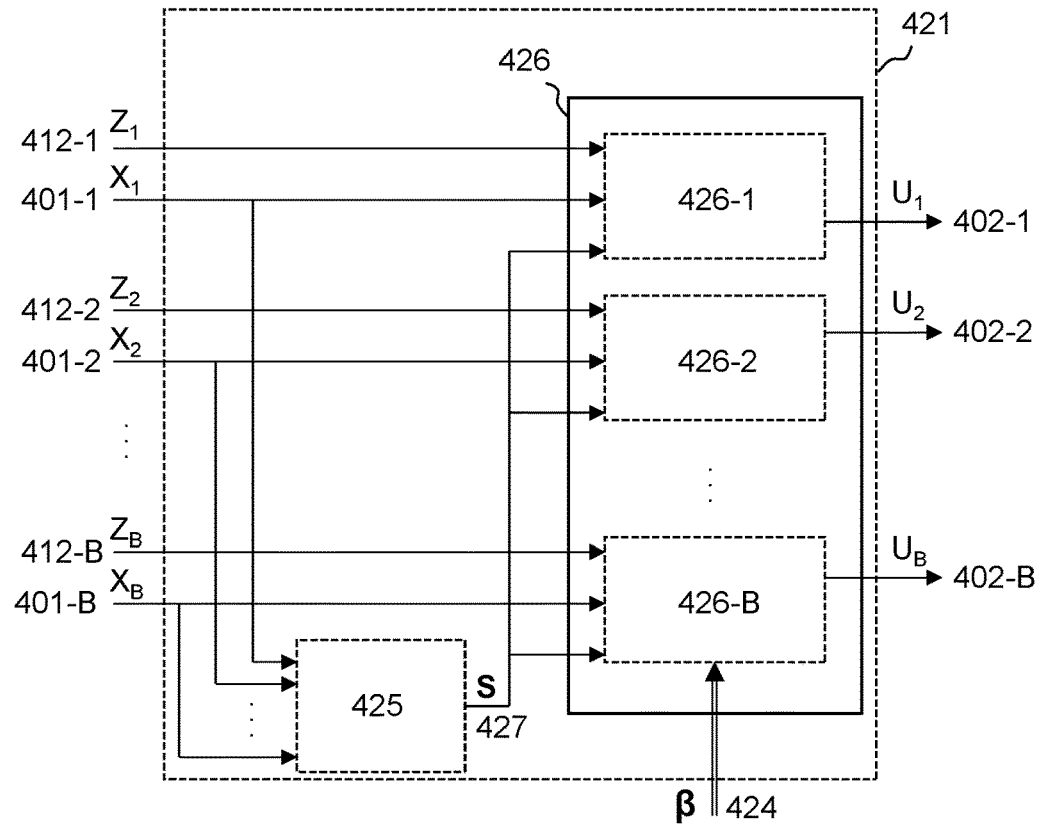

This means e.g. that the DPD actuator 311 may be implemented as shown in FIG. 4A and the DPD actuator 321 may be implemented as the DPD actuator 421 shown in FIG. 4B FIG. 4 thus schematically show how DPD actuators of the first and second DPD parts according to embodiments herein, e.g. as in the DPD arrangement 300, can be implemented in a scalable and computational efficient way.

FIG. 4A schematically shows how a DPD actuator 411, that may correspond to the DPD actuator 311 above, of a first DPD part that may correspond to the first DPD part 310 may be implemented according to some embodiments herein. Multiple digital input signals 401-1 ... 401-B that may correspond to the multiple digital input signals 301-1 ... 301-B are input to a MBIM block 415, or MBIM module, and to a full band digital predistorter (DPD) bank 416 that comprises single band DPDs 416-1 ... 416-B, i.e. a DPD per band, where each single band DPD receives a corresponding one of said input signals. The MBIM module 415 outputs intermodulation products 417, e.g. S as above in Equation 3b, to the DPD bank 416 and to each of the single band DPDs. Note that the same intermodulation products 417, e.g. S, here is input to all single band DPDs and that each single band DPD is dual input. See e.g. Equation 3; whereas the MBIM block 415 is dependent on the number of bands B, the DPD structure for each band can be decoupled and can be made dual input, resulting in said single band DPDs. Such dual input DPD can be repeated B times, hence making the structure scalable with bands as depicted in the figure. DPD coefficients 414, e.g. corresponding to the DPD coefficients 314 and a above, are input to the DPB bank 416. The DPD bank 416 or particularly the single band DPDs thereof, operate on the input signals, respectively, and provide an output per input signal, forming intermediate signals 412-1 ... 412-B, e.g. corresponding to the intermediate signals 312-1 ... 312-B and Z above.

FIG. 4B schematically shows the corresponding structure as in FIG. 4A but how a DPD actuator 421, that may correspond to the DPD actuator 321 above, of a second DPD part, that may correspond to the second DPD part 320, may be implemented according to some embodiments herein. The same multiple digital input signals 401-1 ... 401-B as input to the DPD actuator 411 in FIG. 4A are input to a MBIM block 425, or MBIM module, and to a full band DPD bank 426 that comprises single band DPDs 426-1 ... 426-B, i.e. also here one DPD per band, where each single band DPD receives a corresponding one of said input signals. Further, since the FIG. 4 embodiments are for implementing the cascade, or sequential, first and second part DPDs, the DPD actuator 421 also has the intermediate signals 412-1 ... 412-B from the DPD actuator 411 of the first DPD part, as input. In particularly these signals are input to the full band DPD bank 426, where each single band DPD receives a corresponding one of said intermediate signals.

Also there the MBIM block 425 outputs intermodulation products 427, e.g. S as above in Equation 3b, to the DPD bank 426 and to each of the single band DPDs. Also here the same intermodulation products, e.g. S, is input to all single band DPDs. The MBIM blocks 417 and 427 may advantageously be the same, and thus the same computations and resulting intermodulation products, e.g. S, can be shared between the first and second DPD parts and said DPD actuators 411, 421. See e.g. Equation 6. In fact the same MBIM block resulting intermodulation products as can also be used by the DPD adaptors of the first and second parts, further contributing to implementational and computational efficiency of embodiments herein.

Further, it can be noted that the single band DPDs are here triple input and can be repeated B times making this second DPD part, e.g. out-of-carrier DPD, and DPD actuator 421 also scalable with bands as illustrated in the figure.

Moreover, DPD coefficients 424, e.g. corresponding to the DPD coefficients 324 and β above, are also input to the DPB bank 426.

The DPD bank 426, or particularly the single band DPDs thereof operate on the input and intermediate signals, respectively, and provide an output per input signal, resulting in predistorted multiple digital output signals 402-1 ... 402-B corresponding to the predistorted multiple digital output signals 302-1 ... 302-B and U above.

DPD Adaptation and Coefficients

The coefficient adaptions, i.e. provision of α and β above, similar or corresponding methods as in the prior art may be used. The following is an example that describes an implementation of adaptation for the above exemplified cascade architecture. To estimate the DPD coefficients for both stages, one can employ least square (LS) or other types of adaptive/iterative algorithms e.g., least mean square, normalized least mean square etc. Here it is briefly explained coefficient extraction using LS. As explained above, one can re-write Equations 3 and 6 for l:th band as:

$$Z_l = X_{l,0} + (X_l \circ S)\alpha_l \quad \text{(Eq. 7)}$$

$$Z_l = X_{l,0} + (X_l \circ S)\alpha_l \quad \text{(Eq. 8)}$$

Here $\alpha_l = [\alpha_{l,0}, \ldots, \alpha_{l,m}, \ldots, \alpha_{l,M}]$ and $\beta_l = [\beta_{l,0}, \ldots, \beta_{l,m}, \ldots, \beta_{l,M}]$ are both $(M+1)*N_{coeff}$ element vector. The goal is to identify correct $\alpha_l$ and $\beta_l$ for each $l^{th}$ band independently. Several possibilities can be considered here. For example, joint adaptation of $\alpha_l$ and $\beta_l$ can be formulated. However, joint adaptation may lead to slower convergence and increases computational complexity. Hence, stagewise adaptation wherein the full band DPD coefficients i.e., $\alpha_l$ are first adapted and then the out of carrier DPD coefficients i.e., $\beta_l$ are adapted. Denoting Y (as above) for the signal measured at PA output, the update to coefficients $\alpha_l$ and $\beta_l$ can be estimated for each band using Moore-Penrose pseudoinverse formulation as in Equations 9 and 10 below, which is well known in the context of linearization. Note that $Y_l$ is here derived by sending Y through bandpass filter centered at the bands to be linearized. In other words, $Y_l$ only considers linearization bandwidth of the $l^{th}$ band by passing through a bandpass filter. Here $(\cdot)^H$ denotes Hermitian transpose.

$$\Delta\alpha_l = (R_1^H R_1)^{-1} R_1^H (X_l - Y_l), \text{ where } R_1 = X_l \circ S \quad \text{(Eq. 9)}$$

$$\Delta\beta_l = (R_2^H R_2)^{-1} R_2^H (H_l(-Y_l)), \text{ where } R_2 = H_l(X_l \circ S) \quad \text{(Eq. 10)}$$

As used herein, and in line with conventional usage for DPDs, the set of base functions of the first DPD part, e.g. 310 or 410, which may be named a first set of basis functions, may corresponds to $X \circ S$. The set of base functions of the second DPD part, e.g. 320 or 420, which may be named a second set of basis functions, may correspond to $H(X \circ S)$, where H corresponds to application of notch filters, and thus the second set of basis functions may be considered and be provided as a notch filtered version of the first set of basis functions. The notch filters are further discussed below. Moreover, as used herein, and in line with conventional usage for DPDs, the non-linear terms of a DPD is the result from the DPD coefficients applied to the basis functions of the respective DPD. For example, the nonlinear terms of the first DPD may correspond to $(X \circ S)\alpha$ and the nonlinear terms of the second DPD may correspond to $H(X \circ S)\beta$.

The coefficients may be updated as in Equations 11 below for the next application of the actuator. Learning rates denoted by parameters $\gamma$ and $\mu$ may be tuned according to performance requirements for a specific case.

$$\alpha_l = \alpha_l + \gamma \Delta \alpha_l$$

$$\beta_l = \beta_l + \mu \Delta \beta_l \quad \text{(Eq. 11)}$$

To summarize what has been discussed and concluded above regarding the first and second DPD parts, and respective actuators and adaptors, and to facilitate implementation based on this, flowcharts according to FIGS. 5-6 have been provided.

FIG. 5 are thus flowcharts regarding how the actuators of the first and second DPD parts according to embodiments herein may be implemented as methods, e.g. the actuator 311 or 411 of the first DPD part 310 or 410 and the actuator 321 or 421 of the second DPD part 320 or 420.

Figure 5A:
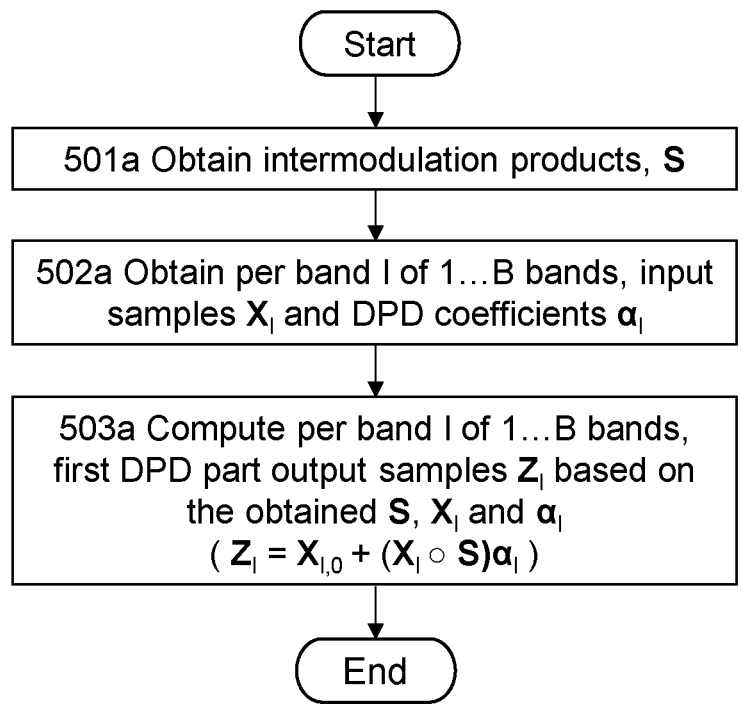
FIG. 5 are flowcharts regarding how DPD actuators of first and second DPD parts according to embodiments herein may be implemented.

FIG. 5A is a flowchart with actions exemplifying how e.g. the actuator 311 or 411 of the first DPD part 310 or 410 may be implemented according to some embodiments herein. Reference numerals from FIG. 4A will mainly be used as example in the following.

Action 501a

The actuator 411 obtains, e.g. receives, intermodulation products, e.g. S. These may e.g. be computed as in Equation 3b, e.g. by MBIM block 415 as in FIG. 4A. In some embodiments, there is a MBIM block that may be common for actuators and/or adaptors of the first and second parts that the actuator in this action receives the intermodulation products from.

Action 502a

The actuator 411 obtains per band 1 of 1 . . . B bands, input samples $X_l$, corresponding to the input signals e.g. 401-1 . . . 401-B, and DPD coefficients $\alpha_l$. The DPD coefficients are typically received from the adaptor associated with the actuator, e.g. 313 when the actuator is actuator 311.

Action 503a

The actuator 411 computes per band 1 of 1 . . . B bands, first DPD part output samples $Z_l$, corresponding to the intermediate signals 312-a . . . 312-B, based on the obtained S, $X_l$ and $\alpha_l$. The computations may correspond to $Z_l = X_{l,0} + (X_l \circ S)\alpha_l$, see e.g. Equations 3 and 7 above.

As realized Actions like in Action 502a-503a may be performed one input signal and band at a time, i.e. perform for one band and then repeat for next etc.

Further note that there may be a separate action between Action 502a and 503a where basis functions are first computed according to $X_l \circ S$, then the output in Action 503b is computed based on this result.

Figure 5B:
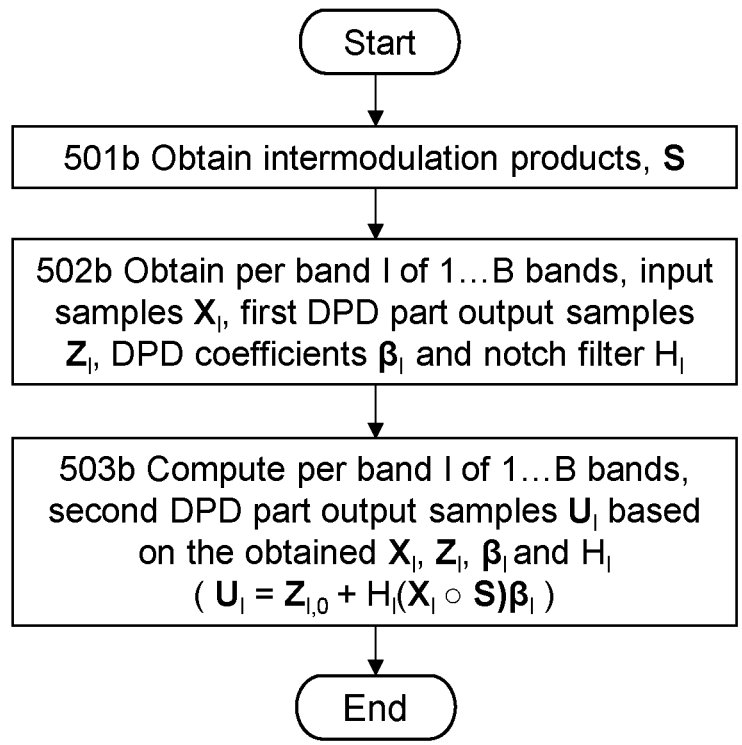

FIG. 5B is a flowchart with actions exemplifying how e.g. the actuator 321 or 421 of the second DPD part 320 or 420 may be implemented according to some embodiments herein. Reference numerals from FIG. 4A will mainly be used as example in the following.

Action 501b

The actuator 421 obtains, e.g. receives, intermodulation products, e.g. S. These may e.g. be computed as in Equation 3b, e.g. by MBIM block 425 as in FIG. 4B. In some embodiments, there is a MBIM block that may be common for actuators and/or adaptors of the first and second parts that the actuator in this action receives the intermodulation products from.

Action 502b

The actuator 411 obtains per band 1 of 1 . . . B bands, input samples $X_l$, corresponding to the input signals e.g. 401-1 . . . 401-B, the first DPD part output samples $Z_l$, corresponding to the intermediate signals 312-a . . . 312-B, DPD coefficients $\beta_l$ and notch filter $H_l$. The DPD coefficients are typically received from the adaptor associated with the actuator, e.g. 323 when the actuator is actuator 321. The notch filer may be predefined or and/or defined in relation to the frequency bands of the input signals. The notch filter is further discussed separately below.

Action 503b

The actuator 411 computes per band 1 of 1 . . . B bands, first DPD part output samples $Z_l$, corresponding to the intermediate signals 312-a . . . 312-B, based on the obtained S, $X_l$, $Z_l$, $\beta_l$ and $H_l$. The computations may correspond to $U_l = Z_{l,0} + H_l(X_l \circ S)\beta_l$, see e.g. Equations 6 and 8 above.

As realized Actions like in Action 502b-503b may be performed one input signal and band at a time and be repeated for all bands B.

Note that there may be a separate action between Action 502b and 503b where basis functions are first computed according to $H_l(X_l \circ S)$, then the output in Action 503b based on the result. The computation of the basis functions may involve applying the notch filters $H_l$ to basis functions computed and used for the first DPD part.

FIG. 6 are flowcharts regarding how the adaptors of the first and second DPD parts according to embodiments herein may be implemented, e.g. the adaptor 313 of the first DPD part 310 and the adaptor 323 of the second DPD part 320.

Figure 6A:
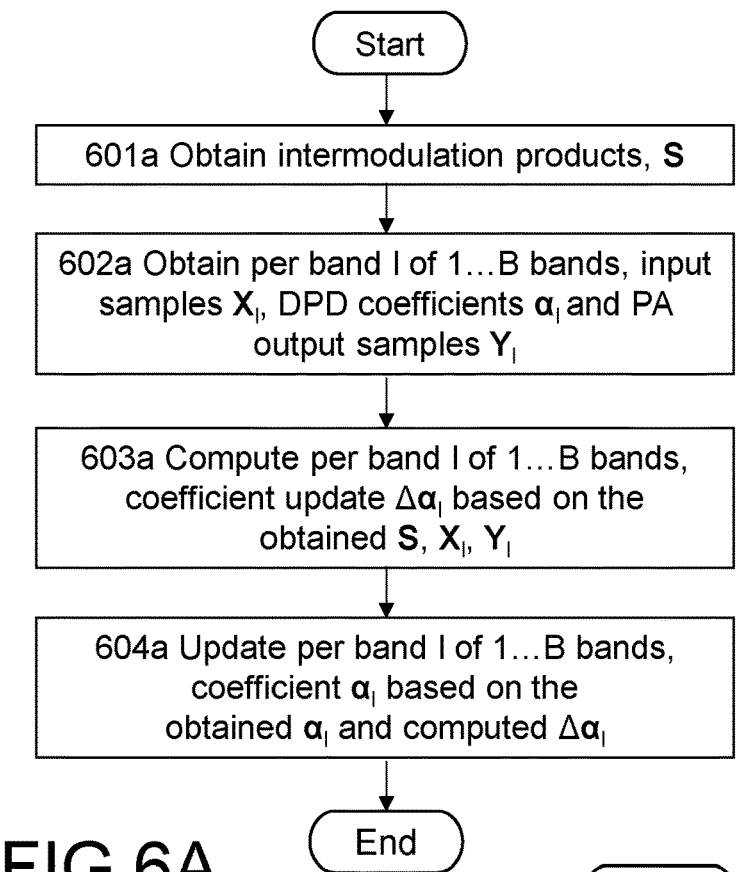
FIG. 6 are flowcharts regarding how DPD adaptors of first and second DPD parts according to embodiments herein may be implemented.

FIG. 6A is a flowchart with actions exemplifying how e.g. the adaptor 313 of the first DPD part 310 may be implemented according to some embodiments herein. Reference numerals from FIGS. 3A and 4A will mainly be used as example in the following.

Action 601a

The adaptor 313 obtains, e.g. receives, intermodulation products, e.g. S. These may e.g. be computed as in Equation 3b, e.g. by MBIM block 415 as in FIG. 4A or similar. In some embodiments, there is a MBIM block that may be common for actuators and/or adaptors of the first and second parts that the adaptor in this action receives the intermodulation products from.

Action 602a

The adaptor 313 obtains per band l of the 1 . . . B bands, input samples $X_l$ from the input signals e.g. 301-1 . . . 301-B, DPD coefficients $\alpha_l$ and PA output samples $Y_l$, e.g. from the digital feedback signals 305-1 . . . 305-B.

Action 603a

The adaptor 313 computes per band l of the 1 . . . B bands, coefficient update $\Delta\alpha_l$ based on the obtained S, $X_l$, $Y_l$. See e.g. Equation 9 above.

Action 604a

The adaptor 313 updates per band l of the 1 . . . B bands, coefficients $\alpha_l$ based on the obtained $\alpha_l$ and computed $\Delta\alpha_l$. See e.g. Equation 11 above.

As realized Actions like in Action 602a-604a may be performed one input signal and band at a time and be repeated for all bands B.

Figure 6B:
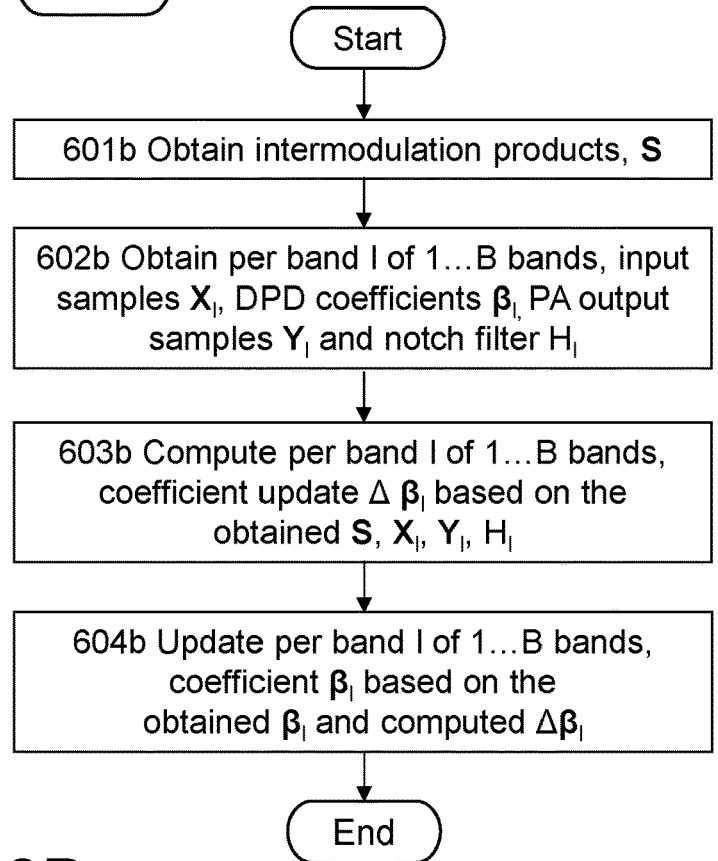

FIG. 6B is a flowchart with actions exemplifying how e.g. the adaptor 323 of the second DPD part 320 may be implemented according to some embodiments herein. Reference numerals from FIGS. 3B and 4B will mainly be used as example in the following.

Action 601b

The adaptor 323 obtains, e.g. receives, intermodulation products, e.g. S. These may e.g. be computed as in Equation 3b, e.g. by MBIM block 425 as in FIG. 4B or similar. In some embodiments, there is a MBIM block that may be common for actuators and/or adaptors of the first and second parts that the adaptor in this action receives the intermodulation products from.

Action 602b

The adaptor 323 obtains per band l of the 1 . . . B bands, input samples $X_l$ from the input signals e.g. 301-1 . . . 301-B, DPD coefficients $\beta_l$, PA output samples $Y_l$ e.g. from the digital feedback signals 305-1 . . . 305-B, and notch filter $H_l$.

Action 603b

The adaptor 323 computes per band l of the 1 . . . B bands, coefficient update $\Delta\beta_l$ based on the obtained S, $X_l$, $Y_l$ and $H_l$. See e.g. Equation 10 above.

Action 604b

The adaptor 323 updates per band l of the 1 . . . B bands, coefficient $\beta_l$ based on the obtained $\beta_l$ and computed $\Delta\beta_l$. See e.g. Equation 11 above.

As realized Actions like in Action 602b-604b may be performed one input signal and band at a time and be repeated for all bands B.

FIG. 7 schematically show examples of two typical notch filter specifications for a band with contiguous carriers and one with non-contiguous carriers. Carrier is here referring to the frequency band of the input signals, e.g. 401-1 . . . 401-B, subject for the DPD.

Figure 7A:
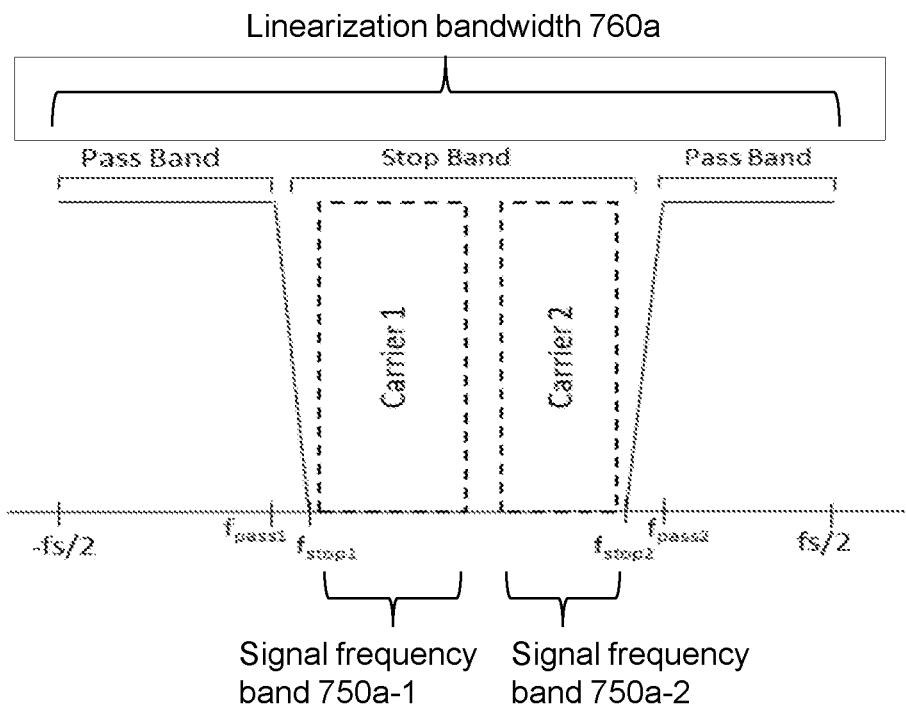
FIG. 7 schematically show examples of two typical notch filter specifications for a band with contiguous carriers and one with non-contiguous carriers.
Figure 7B:
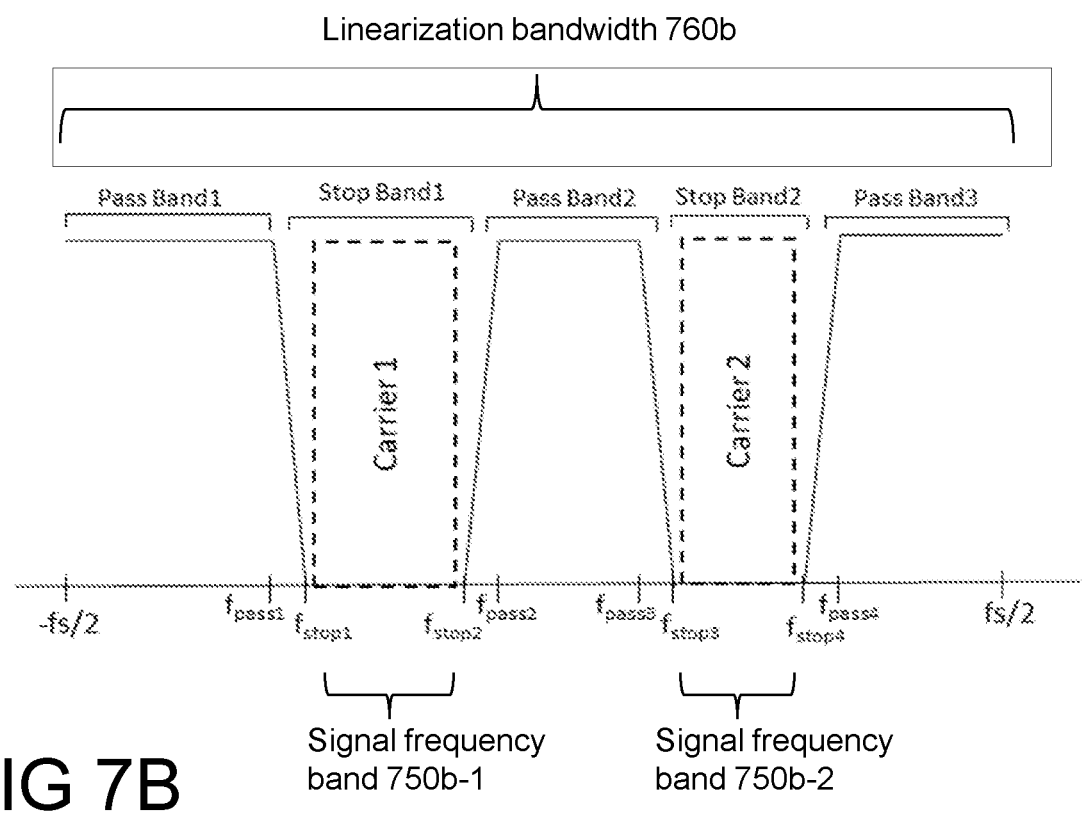

FIG. 7A schematically shows a typical notch filter $H_l$ specifications for contiguous carriers and FIG. 7B a typical notch filter specifications for non-contiguous carriers in a band.

The figures are rather self-explanatory, upper and lower frequencies of pass bands, $f_{pass}$, and upper an lower frequencies of stop bands, $f_{stop}$, etc. Also, a linearization bandwidth is shown in each figure, being the linearization bandwidth associated with and to be used for the DPD to be performed for the carrier signals. More particularly a linearization bandwidth 760a and a linearization bandwidth 760b are shown. The former covers carrier corresponding to a signal frequency band 750a-1 and the latter covers carrier corresponding to signal frequency band 750a-2.

Note that what is shown in these figures may be considered a special case with regard to linearization bandwidth, with a linearization bandwidth that is used for more than one input signal, i.e. more than one carrier. In general for embodiments herein, there is one linearization bandwidth associated with each signal subject for the DPD, but some of these linearization bandwidth may be the same. Different linearization bandwidths may be desirable to use when carriers are not adjacent but spaced apart that a lot of "white spaces" would be covered if signals shared linearization bandwidth.

The notch filters mentioned above, e.g. $H_l(\ )$ used for the second part or "out of carrier" DPD, e.g. with specification as shown in FIG. 7, may, as should be realized by the skilled person, be constructed in a variety of ways. For example, it can be a time domain complex finite impulse response (FIR) filter with multiple stop-bands corresponding to carrier position, e.g. as in FIG. 7B, or it can be a frequency domain filter with somewhat more computational complexity but better performance. One such frequency domain filter may be described by:

$$H_l(z(t))=QPP^H Qz(t) \quad \text{(Eq. 12)},$$

where Q is a discrete Fourier transform (DFT) matrix of size N×N, P is a permutation matrix of size N×(N−L) which is derived from an identity matrix of size N×N, where L rows corresponding carrier frequencies are deleted.

Parallel Structure

Above, embodiments have been discussed that are based on the cascade or sequential structure of first and second DPD parts. However, embodiments herein may also be structured in another order or e.g. have a parallel structure.

In a parallel DPD structure, both the first and second DPD parts adapt their corresponding coefficients independently. In the actuator parts, both DPDs will generate output independently, instead of taking the output from one DPD to another. The output from the first DPD part, e.g. full band DPD, may pass through a filter and may concentrate on the in carrier part to improve EVM. The second DPD part, e.g. out of carrier DPD, similarly should work on outside of the carrier to improve ACLR. Different kinds of weights may be used to tune the performance according to the transmission requirements and corresponding characteristics.

Figure 8:
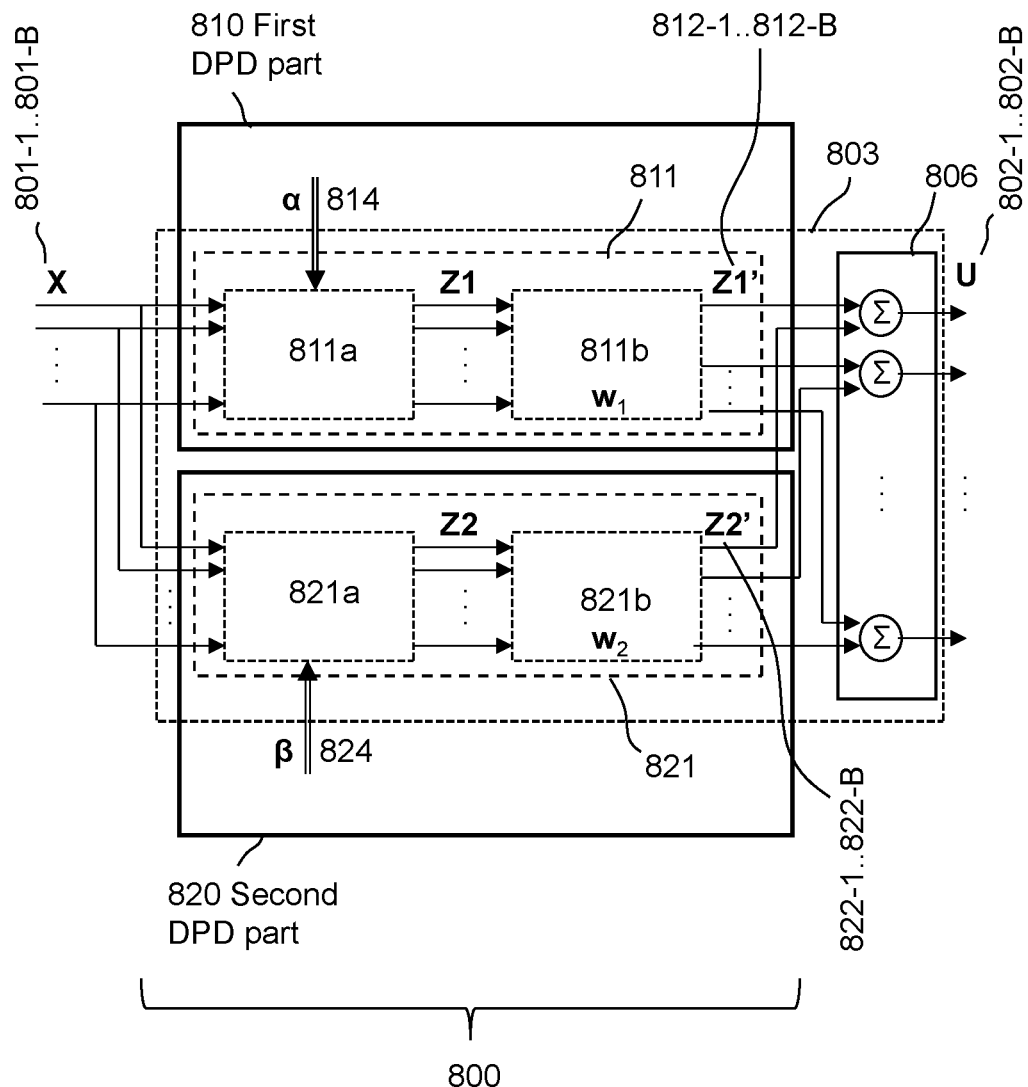
FIG. 8 is a schematic block diagram showing an example of DPD arrangement according to some embodiment herein.

FIG. 8 is a schematic block diagram showing an example of a DPD architecture or DPD arrangement 800 according to some embodiment herein, that operates its first DPD part 810 and second DPD part 820 in parallel. Similar and/or corresponding, or even same, elements as for the DPD arrangement 300 in FIG. 3 have similar numbering and function in the DPD arrangement 800 and FIG. 8. For example:

There is a first DPD part 810 and a second DPD part 820. The DPD arrangement, both the first and second DPD arts 819, 820 operate on multiple digital input signals 801-1 . . . 801-B that also here are denoted X. The output of the DPD arrangement 800 are predistorted multiple digital output signals 802-1 . . . 802-B, also here denoted U.

The first DPD part 810 has a DPD actuator 811a that outputs intermediate signals Z1 and that receives DPD coefficients 814, also here denoted $\alpha$, from a DPD adaptor (not shown) that may correspond to the DPD adaptor 313.

The second DPD part 820 has a DPD actuator 821a that outputs intermediate signals Z2, and that receives DPD coefficients 824, also here denoted $\beta$, from another DPD adaptor (not shown) that may correspond to the DPD adaptor 323.

As mentioned, different kinds of weights may be applied, e.g. in the first DPD part 810 by a weight block 811b with a weight function w1 that operates on Z1 and outputs weighted intermediate signals Z1', in the figure also numbered 812-1 . . . 812-B. In the second DPD part 820 weights may be applied by a weight block 821b with a weight function w2 that operates on Z2 and outputs weighted intermediate signals Z2', in the figure also numbered 822-1 . . . 822-B.

The weights, e.g. a weight functions w1 and w2, may be used to tune performance according to the transmission requirements and corresponding characteristics. Typically, transmission requirements are set by the EVM and ACLR. As such w1 and w2 may be used to provide a tradeoff between EVM and ACLR requirements.

The weighed intermediate signals Z1' and Z2' are then combined by a combination block 806, e.g. by simply adding the corresponding signals to each other as illustrated in the figure and thereby form said predistorted multiple digital output signals 802-1 . . . 802-B or U.

Extension to Generalized Memory Polynomial (GMP)

The following provides input to the skilled person when or if it is desirable to extend what has been described above to also GMP.

Equations 1-6 may be extended to GMP, although some steps may need to readjust, however, the main architecture remains the same. For example, in GMP Equation 1 may instead be written:

$$z_l(n) = x_l(n) + \sum_{m=0}^{M} x_l(n - Q_m)$$ (Eq. 12)

$$\sum_{c=1}^{C} \sum_{p_1=0}^{P-1} \sum_{p_2=0}^{p_1} \alpha_{l,m,c,p_1,p_2,\ldots,p_B} \prod_{b=1}^{B} |x_b(n - Q_m - T_c)|^{(p_b - p_{b+1})}$$

In Equation 12, $T_c$ refers to lag of envelope (when positive) or lead of envelope (when negative) modulation to the current signal for different, $c \in (1, C)$. Number of coefficients as well as computation will be higher in this case. Other required steps can be done following Equations 2 and 3.

Similarly, Equation 4 may be written for GMP as:

$$u_l(n) = z_l(n) + H_l\left(\sum_{m=0}^{M} x_l(n - Q_m) \sum_{c=1}^{C} \sum_{p_1=0}^{P-1} \sum_{p_2=0}^{p_1} \ldots \right.$$ (Eq. 13)

$$\left.\sum_{p_B=0}^{p_{B-1}} \beta_{l,m,c,p_1,p_2,\ldots,p_B} \prod_{b=1}^{B} |x_b(n - Q_m - T_c)|^{(p_b - p_{b+1})}\right)$$

However, this extension requires a greater number of coefficients as well as a higher computational cost.

Experimental Results

Experimental measurements using a wideband power amplifier have been performed to evaluate embodiments herein based on the sequential structure described above. Band 3, band 1, and band 20 were used for RF transmission. Each band supported contiguous multi-carriers/single carrier with 20 MHz bandwidth. A direct learning method was applied for DPD parameter estimation in both DPD parts. Please note that embodiments herein may also be used with an indirect learning algorithm. To provide a fair comparison among different alternatives, some prior art methods, although not described for multiband application, were extended to multiband. An identical simulation setup was used for all the compared methods. The experiments showed that the implementation used in the experiments and based on embodiments herein improved both EVM and ACLR in the first DPD par, i.e. the full band DPD. Furthermore, the second DPD part, i.e. the out of carrier DPD, further improved the ACLR further. The result was a total EVM and ACLR that was better than provided by any of the prior art based solutions compared with.

Figure 9:
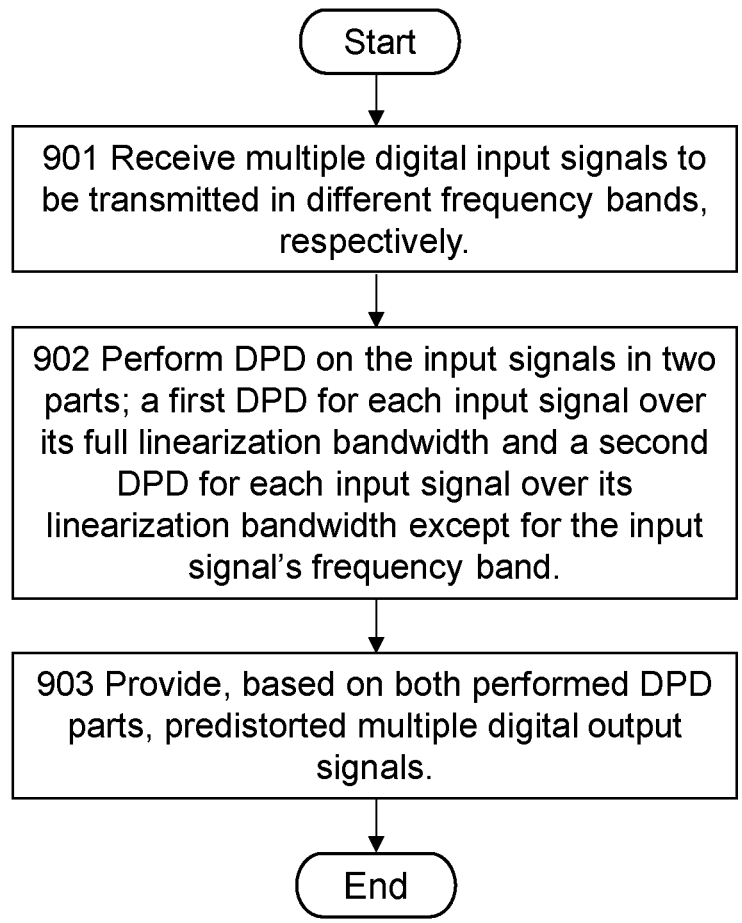
FIG. 9 is a flowchart schematically illustrating embodiments of a method according to embodiments herein

FIG. 9 is a flowchart schematically illustrating embodiments of a method according to embodiments herein. The method is for performing digital predistortion, i.e. DPD, on multiple digital input signals, e.g. 301-1 . . . 301-B or 801-1 . . . 801-B, to be transmitted in different frequency bands, e.g. in 750a-1, 750a-2 or 750b-1, 750b-2, respectively, of a wireless communication network, e.g. the wireless communication network 100. The frequency bands being associated with linearization bandwidths, respectively, for application of the DPD. For example, frequency bands 750a-1, 750a-2 each associated with linearization bandwidth 760a and frequency bands 750b-1, 750b-2, each associated with linearization bandwidth 760b. Each linearization bandwidth extends from a predetermined first frequency below its associated frequency band to a predetermined second frequency above its associated frequency band.

The method may be performed by one or more devices that may correspond to or comprise the DPD arrangement 300 or 800, and/or may correspond to or be comprised in the radio network node 110 or a network node that provides digital signals to be used in wireless transmission by the radio network node 110.

The actions below may be taken in any suitable order and/or be carried out fully or partly overlapping in time when this is possible and suitable.

Action 901

Said device(s) receives said multiple digital input signals, typically on separate, multiple inputs or at least received such that the signals are separable from each other.

This action may fully or partly correspond to Action 502a-b.

Action 902

Said device(s) performs said DPD in two parts:

A first DPD part, e.g. 310, 410 or 810, where a first DPD is performed for each of said multiple digital input signals over the signal's full linearization bandwidth using a first set of non-linear terms, e.g. $(X_l \circ S)\alpha$, including a first set of basis functions, e.g. $(X_l \circ S)$. This part may thus correspond to the "full band" DPD discussed herein A second DPD part, e.g. 320, 420 or 820, where another, second DPD is performed for each of said multiple digital signals over the signal's linearization bandwidth except where the linearization bandwidth covers the signal's frequency band using another, second set of non-linear terms, e.g. $H(X_l \circ S)\beta$, including a second set of basis functions, e.g. $H(X_l \circ S)$. This part may thus correspond to the "out of carrier" DPD discussed herein.

In some embodiments, said first part and second DPDs are performed sequentially; one of said first and second DPDs operating on said multiple digital input signals, e.g. 301-1 . . . 301-B, as input and providing intermediate output signals, e.g. 312-1 . . . 312-B, as output. The other of said first and second DPDs use this output as input, operates on it and provides said predistorted multiple digital output signals, e.g. 302-1 . . . 302-B, as output. These embodiments may correspond to operation based on the sequential structure discussed herein, see e.g. FIG. 3.

In some other embodiments, said first and second DPDs are performed in parallel, both operating on said multiple digital signals, e.g. 801-1 . . . 801-B, as input. Said first part, e.g. 810, provide first intermediate output signals, e.g. 812-1 ... 812-B, as output and said second part, e.g. 820, provided second intermediate output signals, e.g. 822-1 ... 822-B, as output. Said predistorted multiple digital output signals, e.g. 802-1 ... 802-B, being based on a combination, e.g. sum, of said first and second intermediate output signals. In some of these embodiments, said first intermediate output signals, e.g. 812-1 ... 812-B, are first DPD output signals weighed according to a first weight function, e.g. w1, and said second intermediate output signals, e.g. 822-1 ... 822-B, are second DPD output signals weighted according to another, second weight function, e.g. w2. These embodiments may correspond to operation based on the parallel structure discussed herein, see e.g. FIG. 8.

In some embodiments, intermodulation products, e.g. 417 and 427, are computed based on all of said multiple digital input signals, e.g. all of 301-1 ... 301-B, 401-1 ... 401-B, or 801-1 ... 801-B, wherein each basis function of the first set of basis functions is computed based on said computed intermodulation products, e.g. 417, and a single of said multiple digital input signals, e.g. 301-1, 401-1, or 801-1, and/or wherein each basis function of the second set of basis functions is computed based on said computed intermodulation products, e.g. 427, and a single of said multiple digital input signals, e.g. 301-1, 401-1, or 801-1. The intermodulation products may e.g. correspond to S herein. By first computing intermodulation products based on all input signals, the basis function generation for each frequency band, i.e. per input signal, can be turned into a dual input problem with said computed intermodulation products as one input and the single input signal as the other input. This makes the method according to embodiments herein scalable, facilitates DPD application and implementation of any number of frequency bands and input signals. In other words, embodiments herein facilitate implementation of multiband DPD.

Note that in case these embodiments are combined with the embodiments with the sequential first and second DPD parts, each basis function of the second set of basis functions is computed based said computed intermodulation products, a single of said multiple digital input signals AND a single of the intermediate output signals, e.g. 312-1 ... 312-B, from the first DPD part. However, it is realized that each of these intermediate output signals in turn has been computed in the first DPD part based on the intermodulation products and a single of said multiple digital input signals.

Further, said intermodulation products (417, 427) may be precomputed for different combinations of the input signals based on historical statistics relating to the input signals. This further facilitates implementation, e.g. by enabling faster execution and/or more computational efficient implementation.

In some embodiments, intermodulation products, e.g. 417 or 427, are computed based on all of said multiple digital input signals, and both the first DPD part, e.g. 310, 410 or 810, and the second DPD part, e.g. 320, 420 or 820, perform DPD based on these computed intermodulation products. That is, the computed intermodulation products may be shared between the first and second DPD parts, or in other words, the first and second DPDs may be performed using the same computed intermodulation products.

Moreover, in some embodiments, notch filters, e.g. corresponding to $H_i(\ )$ above, are used to accomplish said exception of the frequency bands of the multiple digital input signals when performing the second DPD, e.g. 320, 420 or 820. In these embodiments, said second set of basis functions correspond to notch filtered versions of the first set of basis function, e.g. ($X_i \circ S$), in correspondence with these notch filters, e.g. $H(X_i \circ S)$.

This action may fully or partly correspond to Actions 503a-b.

Action 903

Said device(s) provides, based on both of said performed DPD parts, predistorted multiple digital output signals, e.g. 302-1 ... 302-B or 802-1 ... 802-B. The predistorted multiple digital output signals are thus predistorted versions of the multiple digital input signals, respectively.

This action may fully or partly correspond to Action 503b.

As already indicated above, linearization bandwidth is a concept used also in prior art DPD methods and is there, as well as used herein, referring to the frequency range for application of the DPD, i.e. where it is desirable to accomplish linearization through DPD. Note that although each signals frequency band is associated with a linearization bandwidth according to embodiments herein, in some embodiments the same linearization bandwidth may be used for multiple frequency bands. This may typically be the case if frequency bands are adjacent or close to each other, but typically not in case frequency bands are widely spaced apart. Exactly how to select linearization bandwidth to be used in a practical case may depend on several factors, such as requirements to be met etc., but is as such not central for embodiments herein.

By performing DPD as above, i.e. in said two parts, it is enabled improvements with regard to both EVM and ACLR compared to prior art methods. Further, it is enabled scalable and computational efficient implementation, well suitable for multiband, especially in cases where the number of input signals and frequency bands are many, such as 3 or more. In other words, thanks to the above method and embodiments herein it is enabled improved DPD as well as versatile and scalable implementation of this DPD. Moreover, the method can be implemented using a scalable architecture that facilitates practical application. Moreover, despite that the method is based on performing DPD in two parts, computation of intermodulation products can be shared between the parts, thus supporting efficient implementation.

Also, the first and second DPD parts as above enable them to be set up and operate in relation to each other, as explained below, e.g. sequentially or in parallel, depending on what is most suitable in a practical case and in view of requirements to be met.

Moreover, it should be implicit that each DPD in general, as in the prior at, as well as for embodiments herein, involves a DPD actuation part and DPD adaptation part. The DPD adaptation part computes and provides DPD coefficients to the DPD actuation part, which DPD coefficients are based on feedback, i.e. on previously predistorted signals after power amplification. Details about this, the adaptation part, said coefficients and how they can be computed for embodiments herein, have been left out in description of embodiments discussed above in relation to FIG. 9 in order not to obscure with too many details since the adaptation part and computation of the DPD coefficients, e.g. α and β as discussed herein, may be as in the prior art.

However, next a section follows to set embodiments above in context with also such details that should be considered implicit. Hence, for some embodiments:

Said first DPD part, e.g. 310 or 810, comprises a first DPD actuation sub-part, e.g. 311 or 811, and a first DPD adaptation sub-part, e.g. 313, and said second DPD part, e.g. 320 or 820 comprises a second DPD actuation sub-part, e.g. 321, and a second DPD adaptation sub-part, e.g. 323. Said first and second DPD adaptation sub-parts being configured to receive feedback signals, e.g. Y, from after power amplification of said predistorted multiple digital output signals, e.g. U. Said first DPD adaptation sub-part, e.g. 313, being further configured to, based on the received feedback signals, e.g. Y, and typically also the input signals, e.g. X, to the first DPD part, e.g. 310, provide first DPD coefficients, e.g. 314 or α, to the first DPD actuation sub-part. Said second DPD adaptation sub-part, e.g. 323, being further configured to, based on the received feedback signals, e.g. Y, and typically also the input signals, e.g. X, provide second DPD coefficients, e.g. 324 or β, to the second DPD actuation sub-part, e.g. 321. The first DPD actuation part 311 performs the first DPD based on the input signals, e.g. X, and the first DPD coefficients, e.g. 314 or α. The second DPD actuation part performs the second DPD based on input signals to the second DPD part, e.g. X and/or Z, and the second DPD coefficients, e.g. 324 or β.

Figure 10:
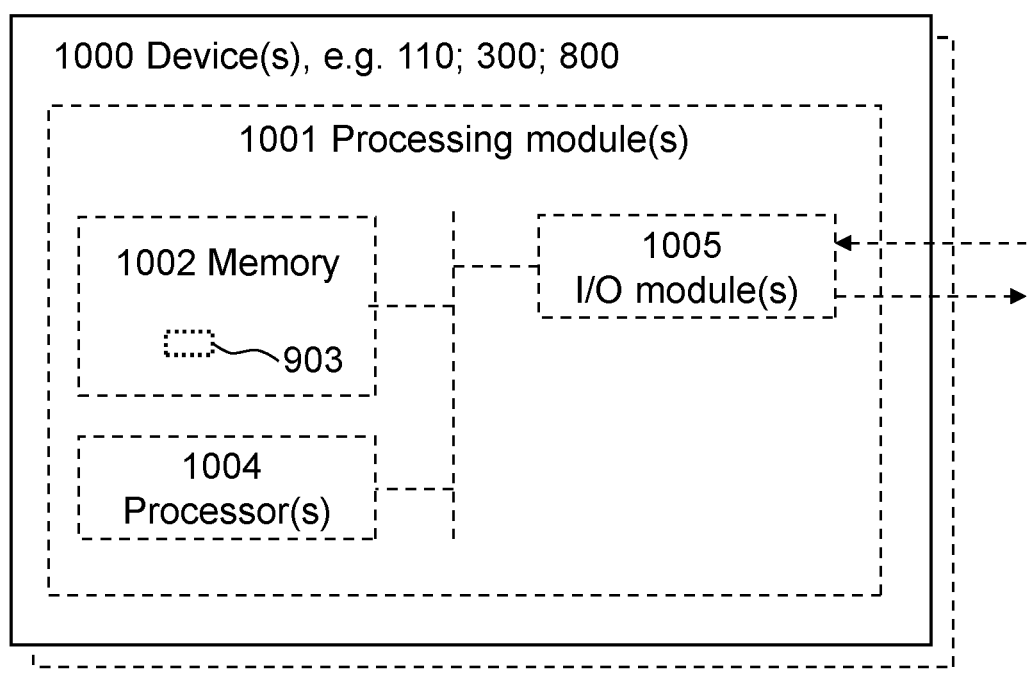
FIG. 10 is a schematic block diagram for illustrating embodiments of how one or more devices may be configured to perform the method and actions discussed in connection with FIG. 9.

FIG. 10 is a schematic block diagram for illustrating embodiments of how one or more devices 1000 may be configured to perform the method and actions discussed above in connection with FIG. 9. The device(s) 1000 may e.g. correspond to or comprise the DPD arrangement 300 or 800, and/or may correspond to, or to be comprised in, the radio network node 110 or a network node that provide digital signals to be transmitted by the radio network node 110.

Hence, said device(s) 1000 are for performing digital predistortion, DPD, on multiple digital input signals, e.g. 301-1 . . . 301-B, 401-1 . . . 401-B or 801-1 . . . 801-B, to be transmitted in different frequency bands, e.g. in 750a-1, 750a-2 or 750b-1, 750b-2, respectively, of a wireless communication network, e.g. 100. The frequency bands being associated with linearization bandwidths, respectively, for application of the DPD. For example, frequency bands 750a-1, 750a-2 each associated with linearization bandwidth 760a and frequency bands 750b-1, 750b-2, each associated with linearization bandwidth 760b. Each linearization bandwidth extends from a predetermined first frequency below its associated frequency band to a predetermined second frequency above its associated frequency band.

The device(s) 1000 may comprise processing module(s) 1001, such as a means, one or more hardware modules, including e.g. one or more processors, and/or one or more software modules for performing said method and/or actions.

The device(s) 1000 may further comprise memory 1002 that may comprise, such as contain or store, computer program(s) 1003. The computer program(s) 1003 comprises 'instructions' or 'code' directly or indirectly executable by the device(s) 1000 to perform said method and/or actions. The memory 1002 may comprise one or more memory units and may further be arranged to store data, such as configurations and/or applications involved in or for performing functions and actions of embodiments herein.

Moreover, the device(s) 1000 may comprise processor(s) 1004, i.e. one or more processors, as exemplifying hardware module(s) and may comprise or correspond to one or more processing circuits. In some embodiments, the processing module(s) 1001 may comprise, e.g. 'be embodied in the form of' or 'realized by' processor(s) 1004. In these embodiments, the memory 1002 may comprise the computer program 1003 executable by the processor(s) 1004, whereby the device(s) 1000 is operative, or configured, to perform said method and/or actions thereof.

Typically the device(s) 1000, e.g. the processing module(s) 1001, comprises Input/Output (I/O) module(s) 1005, configured to be involved in, e.g. by performing, any communication to and/or from other units and/or devices, such as sending and/or receiving information to and/or from other devices. The I/O module(s) 1005 may be exemplified by obtaining, e.g. receiving, module(s) and/or providing, e.g. sending, module(s), when applicable.

Further, in some embodiments, the device(s) 1000, e.g. the processing module(s) 1001, comprises one or more of an receiving module(s), performing module(s), providing module(s), as exemplifying hardware and/or software module(s) for carrying out actions of embodiments herein. These modules may be fully or partly implemented by the processor(s) 1004.

Hence:

The device(s) 1000, and/or the processing module(s) 1001, and/or the processor(s) 1004, and/or the I/O module(s) 1005, and/or the receiving module(s) are thus operative, or configured, to receive said multiple digital input signals.

The device(s) 1000, and/or the processing module(s) 1001, and/or the processor(s) 1004, and/or the I/O module(s) 1005, and/or the performing module(s) are further operative, or configured, to perform said DPD in said two parts.

The device(s) 1000, and/or the processing module(s) 1001, and/or the processor(s) 1004, and/or the I/O module(s) 1005, and/or the providing module(s) are also operative, or configured, to provide, based on both of said performed DPD parts, said predistorted multiple digital output signals.

Figure 11:
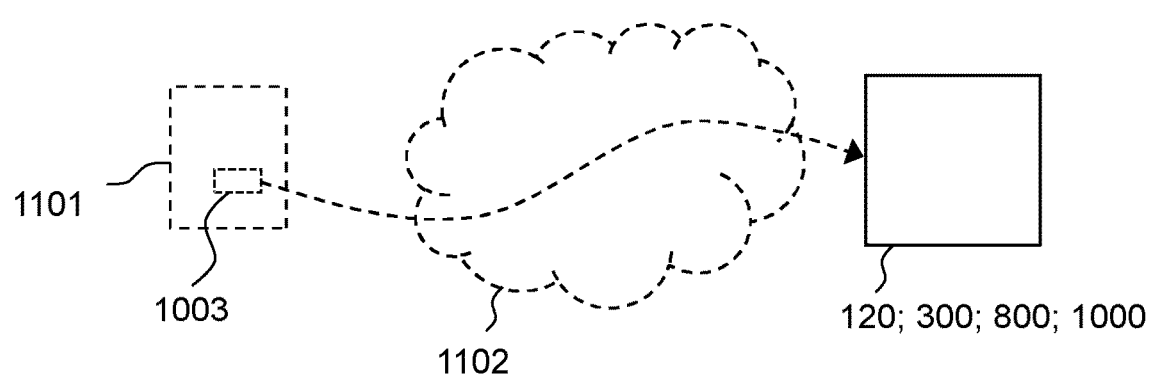
FIG. 11 is a schematic drawing illustrating some embodiments relating to computer program(s) and carriers thereof to cause the device(s) to perform said method and related actions.

FIG. 11 is a schematic drawing illustrating some embodiments relating to computer program(s) and carriers thereof to cause said device(s) 1000 discussed above to perform said method and related actions. The computer program(s) may be the computer program(s) 1003 and comprises instructions that when executed by the processor(s) 1004 and/or the processing module(s) 1001, cause the device(s) 1000 to perform as described above. In some embodiments there is provided carrier(s), or more specifically data carrier(s), e.g. computer program product(s), comprising the computer program(s). Each carrier may be one of an electronic signal, an optical signal, a radio signal, and a computer readable storage medium, e.g. a computer readable storage medium or media 1101 as schematically illustrated in the figure. The computer program(s) 1003 may thus be stored on such computer readable storage medium 1101. By carrier may be excluded a transitory, propagating signal and the data carrier may correspondingly be named non-transitory data carrier. Non-limiting examples of the data carrier(s) being computer readable storage medium or media is a memory card or a memory stick, a disc storage medium such as a CD or DVD, or a mass storage device that typically is based on hard drive(s) or Solid State Drive(s) (SSD). The computer readable storage medium or media 1101 may be used for storing data accessible over a computer network 1102, e.g. the Internet or a Local Area Network (LAN). The computer program(s) 1003 may furthermore be provided as pure computer program(s) or comprised in a file or files. The file or files may be stored on the computer readable storage medium or media 1101 and e.g. available through download e.g. over the computer network 1102 as indicated in the figure, e.g. via a server. The file or files may e.g. be executable files for direct or indirect download to and execution on said device(s) 1000 to make it or them perform as described above, e.g. by execution by the processor(s) 1004. The file or files may also or alternatively be for intermediate download and compilation involving the same or another processor(s) to make them executable before further download and execution causing said device(s) 1000 to perform as described above.

Note that any processing module(s) and circuit(s) mentioned in the foregoing may be implemented as a software and/or hardware module, e.g. in existing hardware and/or as an Application Specific Integrated Circuit (ASIC), a field-programmable gate array (FPGA) or the like. Also note that any hardware module(s) and/or circuit(s) mentioned in the foregoing may e.g. be included in a single ASIC or FPGA, or be distributed among several separate hardware components, whether individually packaged or assembled into a System-on-a-Chip (SoC).

Those skilled in the art will also appreciate that the modules and circuitry discussed herein may refer to a combination of hardware modules, software modules, analogue and digital circuits, and/or one or more processors configured with software and/or firmware, e.g. stored in memory, that, when executed by the one or more processors may make the node(s) and device(s) to be configured to and/or to perform the above-described methods and actions.

Identification by any identifier herein may be implicit or explicit. The identification may be unique in a certain context, e.g. in the wireless communication network or at least in a relevant part or area thereof.

The term "network node" or simply "node" as used herein may as such refer to any type of node that may communicate with another node in and be comprised in a communication network, e.g. IP network or wireless communication network. Further, such node may be or be comprised in a radio network node (described below) or any network node, which e.g. may communicate with a radio network node. Examples of such network nodes include any radio network node, a core network node, Operations & Maintenance (O&M), Operations Support Systems (OSS), Self Organizing Network (SON) node, etc.

The term "radio network node" as may be used herein may as such refer to any type of network node for serving a wireless communication device, e.g. a so called User Equipment or UE, and/or that are connected to other network node(s) or network element(s) or any radio node from which a wireless communication device receives signals from. Examples of radio network nodes are Node B, Base Station (BS), Multi-Standard Radio (MSR) node such as MSR BS, eNB, eNodeB, gNB, network controller, RNC, Base Station Controller (BSC), relay, donor node controlling relay, Base Transceiver Station (BTS), Access Point (AP), New Radio (NR) node, transmission point, transmission node, node in distributed antenna system (DAS) etc.

Each of the terms "wireless communication device", "wireless device", "user equipment" and "UE", as may be used herein, may as such refer to any type of wireless device arranged to communicate with a radio network node in a wireless, cellular and/or mobile communication system. Examples include: target devices, device to device UE, device for Machine Type of Communication (MTC), machine type UE or UE capable of machine to machine (M2M) communication, Personal Digital Assistant (PDA), tablet, mobile, terminals, smart phone, Laptop Embedded Equipment (LEE), Laptop Mounted Equipment (LME), Universal Serial Bus (USB) dongles etc.

While some terms are used frequently herein for convenience, or in the context of examples involving other a certain, e.g. 3GPP or other standard related, nomenclature, it must be appreciated that such term as such is non-limiting Also note that although terminology used herein may be particularly associated with and/or exemplified by certain communication systems or networks, this should as such not be seen as limiting the scope of the embodiments herein to only such certain systems or networks etc.

As used herein, the term "memory" may refer to a data memory for storing digital information, typically a hard disk, a magnetic storage, medium, a portable computer diskette or disc, flash memory, random access memory (RAM) or the like. Furthermore, the memory may be an internal register memory of a processor.

Also note that any enumerating terminology such as first device or node, second device or node, first base station, second base station, etc., should as such be considered non-limiting and the terminology as such does not imply a certain hierarchical relation. Without any explicit information in the contrary, naming by enumeration should be considered merely a way of accomplishing different names.

As used herein, the expression "configured to" may e.g. mean that a processing circuit is configured to, or adapted to, by means of software or hardware configuration, perform one or more of the actions described herein.

As used herein, the terms "number" or "value" may refer to any kind of digit, such as binary, real, imaginary or rational number or the like. Moreover, "number" or "value" may be one or more characters, such as a letter or a string of letters. Also, "number" or "value" may be represented by a bit string.

As used herein, the expression "may" and "in some embodiments" has typically been used to indicate that the features described may be combined with any other embodiment disclosed herein.

In the drawings, features that may be present in only some embodiments are typically drawn using dotted or dashed lines.

As used herein, the expression "transmit" and "send" are typically interchangeable. These expressions may include transmission by broadcasting, uni-casting, group-casting and the like. In this context, a transmission by broadcasting may be received and decoded by any authorized device within range. In case of unicasting, one specifically addressed device may receive and encode the transmission. In case of group-casting, e.g. multicasting, a group of specifically addressed devices may receive and decode the transmission.

When using the word "comprise" or "comprising" it shall be interpreted as nonlimiting, i.e. meaning "consist at least of".

The embodiments herein are not limited to the above described preferred embodiments. Various alternatives, modifications and equivalents may be used. Therefore, the above embodiments should not be taken as limiting the scope of the present disclosure, which is defined by the appending claims.

The invention claimed is:

1. A method, performed by one or more devices, for performing digital predistortion, "DPD", on multiple digital input signals to be transmitted in different frequency bands, respectively, of a wireless communication network, the different frequency bands being associated with linearization bandwidths, respectively, for application of the DPD, each linearization bandwidth extending from a predetermined first frequency below its associated frequency band to a predetermined second frequency above its associated frequency band, wherein the method comprises:
receiving said multiple digital input signals;
performing said DPD in two parts:
  a first DPD part where a first DPD is performed for each of said multiple digital input signals over a signal's full linearization bandwidth using a first set of non-linear terms including a first set of basis functions, and a second DPD part where a second DPD is performed for each of said multiple digital input signals over the signal's linearization bandwidth except where the linearization bandwidth covers a signal's frequency band using a second set of non-linear terms including a second set of basis functions; and providing, based on both of said performed DPD parts, predistorted multiple digital output signals.

2. The method of claim 1, wherein said first and second DPDs are performed sequentially, one of said first and second DPDs operating on said multiple digital input signals as input and providing intermediate output signals as output, the other one of said first and second DPDs operating on the intermediate output signals as input and provides said predistorted multiple digital output signals as output.

3. The method of claim 1, wherein said first and second DPDs are performed in parallel, both operating on said multiple digital input signals as input, said first part providing first intermediate output signals as output and said second part providing second intermediate output signals as output, and wherein said predistorted multiple digital output signals are based on a combination of said first and second intermediate output signals.

4. The method of claim 3, wherein said first intermediate output signals are first DPD output signals weighed according to a first weight function and said second intermediate output signals are second DPD output signals weighted according to a second weight function.

5. The method of claim 1, wherein intermodulation products are computed based on all of said multiple digital input signals, wherein each basis function of the first set of basis functions is computed based on said computed intermodulation products and a single of said multiple digital input signals, and/or wherein each basis function of the second set of basis functions is computed based on said computed intermodulation products and the single of said multiple digital input signals.

6. The method of claim 5, wherein said intermodulation products are precomputed for different combinations of the multiple digital input signals based on historical statistics relating to the multiple digital input signals.

7. The method of claim 1, wherein intermodulation products are computed based on said multiple digital input signals, and wherein both the first DPD part and the second DPD part perform their DPD based on the computed intermodulation products.

8. The method of claim 1, wherein notch filters are used to accomplish said exception of the different frequency bands of the multiple digital input signals when performing the second DPD, and wherein said second set of basis functions correspond to notch filtered versions of the first set of basis function in correspondence with said notch filters.

9. A non-transitory computer readable medium comprising a computer program including instructions that when executed by one or more processors causes one or more devices to perform the method according to claim 1.

10. A device for performing digital predistortion, "DPD", on multiple digital input signals to be transmitted in different frequency bands, respectively, of a wireless communication network, the different frequency bands being associated with linearization bandwidths, respectively, for application of the DPD, each linearization bandwidth extending from a predetermined first frequency below its associated frequency band to a predetermined second frequency above its associated frequency band, wherein the device is configured to:

receive said multiple digital input signals;

perform said DPD in two parts:

a first DPD part where a first DPD is performed for each of said multiple digital input signals over a signal's full linearization bandwidth using a first set of non-linear terms including a first set of basis functions, and a second DPD part where a second DPD is performed for each of said multiple digital input signals over the signal's linearization bandwidth except where the linearization bandwidth covers a signal's frequency band using a second set of non-linear terms including a second set of basis functions; and provide, based on both of said performed DPD parts, predistorted multiple digital output signals.

11. The device of claim 10, wherein the device is configured to perform said DPD in said two parts such that said first and second DPDs are performed sequentially, one of said first and second DPDs operates on said multiple digital input signals as input and provide intermediate output signals as output, the other one of said first and second DPDs operate on the intermediate output signals as input and provides said predistorted multiple digital output signals as output.

12. The device of claim 10, wherein the device is configured to perform said DPD in said two parts such that said first and second DPDs are performed in parallel, both operate on said multiple digital input signals as input, said first part provides first intermediate output signals as output and said second part provides second intermediate output signals as output, and wherein said predistorted multiple digital output signals are based on a combination of said first and second intermediate output signals.

13. The device of claim 12, wherein said first intermediate output signals are first DPD output signals weighed according to a first weight function and said second intermediate output signals are second DPD output signals weighted according to a second weight function.

14. The device of claim 10, wherein intermodulation products are computed based on all of said multiple digital input signals, wherein each basis function of the first set of basis functions is computed based on said computed intermodulation products and a single of said multiple digital input signals, and/or wherein each basis function of the second set of basis functions is computed based on said computed intermodulation products and the single of said multiple digital input signals.

15. The device of claim 14, wherein said intermodulation products are precomputed for different combinations of the multiple digital input signals based on historical statistics relating to the multiple digital input signals.

16. The device of claim 10, wherein intermodulation products are computed based on said multiple digital input signals, and wherein both the first DPD part and the second DPD part perform their DPD based on the computed intermodulation products.

17. The device of claim 10, wherein notch filters are used to accomplish said exception of the different frequency bands of the multiple digital input signals when performing the second DPD, and wherein said second set of basis functions correspond to notch filtered versions of the first set of basis function in correspondence with said notch filters.

* * * * *